(12) United States Patent
Wang

(10) Patent No.: US 8,093,071 B2
(45) Date of Patent: Jan. 10, 2012

(54) SEMICONDUCTOR DEVICE AND METHOD OF MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/539,694

(22) Filed: Aug. 12, 2009

(65) Prior Publication Data
US 2009/0298204 A1 Dec. 3, 2009

Related U.S. Application Data

(62) Division of application No. 11/554,354, filed on Oct. 30, 2006, now Pat. No. 7,592,657.

(30) Foreign Application Priority Data

Jun. 30, 2006 (JP) ................................ 2006-182300

(51) Int. Cl.
*H01L 21/00* (2006.01)
(52) U.S. Cl. ............. 438/3; 257/295; 438/210; 438/580
(58) Field of Classification Search ............... 438/3, 210, 438/580; 257/295
See application file for complete search history.

(56) References Cited

U.S. PATENT DOCUMENTS

| | | | |
|---|---|---|---|
| 6,169,305 B1 | 1/2001 | Takai et al. | |
| 6,194,228 B1 | 2/2001 | Fujiki et al. | |
| 6,607,988 B2 * | 8/2003 | Yunogami et al. | 438/720 |
| 6,682,944 B2 * | 1/2004 | Kikuchi et al. | 438/3 |
| 6,740,533 B2 | 5/2004 | Takamatsu et al. | |
| 6,746,878 B2 * | 6/2004 | Komuro et al. | 438/3 |
| 6,797,561 B2 | 9/2004 | Ko et al. | |
| 6,847,073 B2 * | 1/2005 | Kanaya | 257/295 |
| 7,139,161 B2 * | 11/2006 | Komuro et al. | 361/321.1 |
| 7,220,600 B2 | 5/2007 | Summerfelt et al. | |
| 7,348,616 B2 * | 3/2008 | Joo et al. | 257/295 |
| 7,368,298 B2 | 5/2008 | Wang | |
| 2003/0089954 A1 | 5/2003 | Sashida | |
| 2003/0201478 A1 | 10/2003 | Tani et al. | |
| 2005/0128663 A1 | 6/2005 | Yamazaki et al. | |

FOREIGN PATENT DOCUMENTS

JP 11-195768 A 7/1999

(Continued)

OTHER PUBLICATIONS

Japanese Office Action dated Dec. 28, 2010, issued in corresponding Japanese Patent Application No. 2006-182300.

*Primary Examiner* — Jarrett Stark
*Assistant Examiner* — Nicholas Tobergte
(74) *Attorney, Agent, or Firm* — Westerman, Hattori, Daniels & Adrian, LLP

(57) ABSTRACT

According to the present invention, a method of fabricating a semiconductor device is provided including forming a first interlayer insulating film 11, a crystalline conductive film 21, a first conductive film 23, a ferroelectric film 24 and a second conductive film 25 on a silicon substrate 1 in sequence, forming a conductive cover film 18 on the second conductive film 25, forming a hard mask 26a on the conductive cover film 18, forming a capacitor upon etching the conductive cover film 18, the second conductive film 25, the ferroelectric film 24 and the first conductive film 23 using the hard mask 26a as an etching mask in areas exposed from the hard mask 26a, and etching the hard mask 26a and the crystalline conductive film 21 exposed from the lower electrode 23a using an etching condition under which the hard mask 26a is etched.

9 Claims, 27 Drawing Sheets

FOREIGN PATENT DOCUMENTS

| | | |
|---|---|---|
| JP | 2000-91539 A | 3/2000 |
| JP | 2000-173999 A | 6/2000 |
| JP | 2003-152165 A | 5/2003 |
| JP | 2003-258201 A | 9/2003 |
| JP | 2005-183841 A | 7/2005 |
| WO | 2006/066261 A2 | 6/2006 |

* cited by examiner before the anneal after the anneal

SEMICONDUCTOR DEVICE AND METHOD OF MANUFACTURING THE SAME

CROSS-REFERENCE TO RELATED APPLICATIONS

This application is a division of Ser. No. 11/554,354, filed Oct. 30, 2006, which is based on and claims priority of Japanese Patent Application No. 2006-182300 filed on Jun. 30, 2006, the entire contents of which are incorporated herein by reference.

BACKGROUND OF THE INVENTION

1. Field of the Invention

The present invention relates to a semiconductor device and method of manufacturing the same.

2. Description of the Related Art

In recent years, with progress in digital technologies, development work has heretofore been made to provide non-volatile memories that can store large volumes of data at high speeds.

As such non-volatile memories, a flush memory and ferroelectric memory have heretofore been known in the art.

Of these, the flush memory includes a floating gate, embedded in a gate insulating film of an insulation gate type field effect transistor (IGFET), wherein information is stored by accumulating electric charges in the floating gate. However, with such a flush memory, a drawback is encountered in that during writing and erasing information, a tunnel current must be passed through the gate insulating film and a relatively high voltage needs to be supplied.

In contrast, the ferroelectric memory is also referred to as FeRAM (Ferroelectric Random Access Memory) that stores information upon utilizing a hysteres is characteristic of a ferroelectric film incorporated in a ferroelectric capacitor. In the ferroelectric film, polarization takes place depending on a voltage applied across upper and lower electrodes of the capacitor, and spontaneous polarization remains even if the voltage is removed. As a polarity of the applied voltage is inversed, the spontaneous polarization is also inverted. Information is written in the ferroelectric film by relating the direction of the spontaneous polarization to "0" and "1". The FeRAM is advantageous in that the voltage necessary for writing is lower than that needed in the flush memory and writing can be accomplished at a faster speed than that in the flush memory.

To take such an advantage, a study has been made to apply a logic embedded chip (SOC: System on Chip), composed of a combination of logic circuits and FeRAM, to an IC card.

By the way, due to compatibility between an upper electrode and a ferroelectric film constituting a ferroelectric capacitor, a ferroelectric characteristic of the ferroelectric capacitor significantly depends on a structure of the upper electrode.

For instance, in Patent Literature 1, the upper electrode has an SRO (SrRuO$_3$) film that is covered with a platinum film, which suppresses the occurrence of mutual reaction between the SRO film and oxide silicon.

Further, in Patent Literature 2, an upper electrode includes an iridium oxide film, an iridium film and a platinum film that are formed in this order. Forming the iridium oxide film as the lowermost layer of the upper electrode allows a capacitor to have an improved fatigue characteristic and, further, the presence of the platinum film on the uppermost layer results in reduction in contact resistance between the upper electrode and a wiring. Also, the presence of the intermediate iridium film results in improved adhesion property between the iridium oxide film and the platinum film.

In the meanwhile, Patent Literature 3 discloses an upper electrode including an iridium oxide film and an iridium film that are formed in this order.

Further, Patent Literature 4 discloses an upper electrode with a structure having a single layer film or a stacked film made of materials such as noble metals including platinum, iridium, etc., and an oxide conductive film such as oxide iridium (IrO$_x$), SRO, oxide platinum (PtO), etc.

Furthermore, Patent Literature 5 discloses an oxide iridium film, a platinum film or an SRO film that are formed as an upper electrode.

[Patent Literature 1] Japanese Patent Laid-Open Publication No. H11-195768

[Patent Literature 2] Japanese Patent Laid-Open Publication No. 2000-91539

[Patent Literature 3] Japanese Patent Laid-Open Publication No. 2000-173999

[Patent Literature 4] Japanese Patent Laid-Open Publication No. 2003-258201

[Patent Literature 5] Japanese Patent Laid-Open Publication No. 2003-152165

SUMMARY OF THE INVENTION

According to one aspect of the present invention, there is provided a semiconductor device comprising: a first interlayer insulating film formed over a semiconductor substrate; a lower electrode formed on the first interlayer insulating film; a capacitor dielectric film formed on the lower electrode and made of ferroelectric material; an upper electrode including a first conductive metal oxide film and a second conductive metal oxide film which are sequentially formed on the capacitor dielectric film to form a capacitor together with the capacitor dielectric film and the lower electrode; and a conductive cover film formed on the upper electrode and made of a platinum-group element except for iridium; wherein a relation $y2/y1 > x2/x1$ holds for compositions AO$_{x1}$ and BO$_{y1}$ (A and B represent metallic elements), where AO$_{x1}$ and BO$_{y1}$ being stoicheiometric compositions of first and second metal oxide film constituting the first and second conductive metal oxide film respectively, and for AO$_{x2}$ and BO$_{y2}$, where AO$_{x2}$ and BO$_{y2}$ being actual compositions of the first and second metal oxides respectively.

According to the present invention, the upper electrode of the capacitor has the first conductive metal oxide film with a composition of AO$_{x2}$ and the second conductive metal oxide film with a composition of BO$_{y2}$ Considering ratios x2/x2 and y2/y1 as ratios of oxidation respectively, the above relationship $y2/y1 > x2/x1$ represents that the second conductive metal oxide film has a higher ratio of oxidation than that of the first conductive metal oxide film.

Increase in the ratio of oxidation of the second conductive metal oxide film results in reduction in catalytic action of metal element B of which the second conductive metal oxide film is formed. This suppresses the amount of hydrogen generated when outside moisture is brought into contact with metal element B, and hence deterioration in the capacitor dielectric film due to hydrogen can be prevented while enabling the capacitor to have an increased remanent polarization charge.

In the meanwhile, the first conductive metal oxide film plays a role of planarizing an interface with the capacitor dielectric film.

Here, a conductivity improving film, composed of metal elements different from metal elements constituting the conductive cover film, may be formed on the second conductive metal oxide film, and a conductive cover film may be formed on the conductivity improving film.

In this case, a second interlayer insulating film covering the capacitor may be formed, and a first conductive plug, made of a glue film and a conductive plug film formed in sequence, may be formed in a first hole formed in the second interlayer insulating film over the upper electrode.

Forming such conductivity improving film makes it possible to lower a contact resistance between the first conductive plug and the upper electrode.

Further, according to another aspect of the present invention, there is provided a method of manufacturing a semiconductor device, the method comprising: forming a first interlayer insulating film over a semiconductor substrate; forming a crystalline conductive film on the first interlayer insulating film; forming a first conductive film on the crystalline conductive film; forming a ferroelectric film on the first conductive film; forming a second conductive film on the ferroelectric film; forming a conductive cover film, made of platinum-group element except for iridium, on the second conductive film; forming a hard mask on the conductive cover film; etching the conductive cover film, the second conductive film, the ferroelectric film and the first conductive film in areas exposed from the hard mask, while using the hard mask as an etching mask, to form a capacitor including an upper electrode made of the second conductive film, a capacitor dielectric film made of the ferroelectric film, and a lower electrode made of the first conductive film; and etching the hard mask and the crystalline conductive film in areas exposed from the lower electrode using an etching condition under which the hard mask is etched.

According to the present invention, the crystalline conductive film is etched in an area exposed from the lower electrode using the etching condition under which the hard mask is etched. Although such etching allows the hard mask to be removed, the conductive cover film is formed on the upper electrode, so that surface of the upper electrode is not exposed to the atmosphere of such etching. Therefore, this prevents constituting elements, such as for instance iridium of the upper electrode, which are hard to be removed even in wet etching, from being released in grain to the etching atmosphere. As a result, the occurrence of a leak path resulting from the iridium grains redeposited onto the side surface of the capacitor dielectric film can be prevented, making it possible to decrease leakage current of the capacitor.

Further, since the first conductive film, playing a role as the lower electrode, is formed on the crystalline conductive film, the lower electrode and the overlaying capacitor dielectric film have a favorable crystallization due to action of the polarization of the crystalline conductive film, resulting in an increase in a ferroelectric characteristic, such as the remanent polarization charge or the like, of the capacitor dielectric film.

Also, a step of exposing a side surface of the capacitor to an etching solution may be executed after the etching of the hard mask and the crystalline conductive film. Such wet treatment removes slight metallic grains released from the upper surface of the conductive cover film during the etching of the crystalline conductive film and deposited onto the side surface of the capacitor, thereby avoiding a possibility of the formation of a leak path due to the metallic grains.

Here, the step of forming the second conductive film may preferably comprise a step of forming a first conductive metal oxide film on the ferroelectric film and a step of forming a second conductive metal oxide film on the first conductive metal oxide film.

In this case, it is preferable that a relation $y2/y1>x2/x1$ holds for compositions $AO_{x1}$ and $BO_{y1}$ (A and B represent metallic elements), where $AO_{x1}$ and $BO_{y1}$ being stoicheiometric compositions of first and second metal oxide constituting the first and second conductive metal oxide film respectively, and for $AO_{x2}$ and $BO_{y2}$, where $AO_{x2}$ and $BO_{y2}$ being actual compositions of the first and second metal oxides respectively According to this, as set forth above, the catalytic action of metal element B constituting the second conductive metal oxide film is lessened, resulting in the suppression of the amount of hydrogen, generated when outside moisture is brought into contact with metal element B, and making it possible to prevent deterioration in the capacitor dielectric film due to hydrogen.

Moreover, the first conductive metal oxide film may be annealed under an oxygen-containing atmosphere after the step of forming the first conductive metal oxide film and before the step of forming the second conductive metal oxide film. Such annealing compensates oxygen deficiencies caused in the ferroelectric films, while planarizing an uneven interface between the first conductive metal oxide film and the ferroelectric film.

DESCRIPTION OF THE PREFERRED EMBODIMENTS

Now, embodiments of the present invention are described below in detail with reference to the accompanying drawings.

(1) Description on Research Result

Research conducted by the present inventor is explained prior to description of the embodiments of the present invention.

Figure 1:
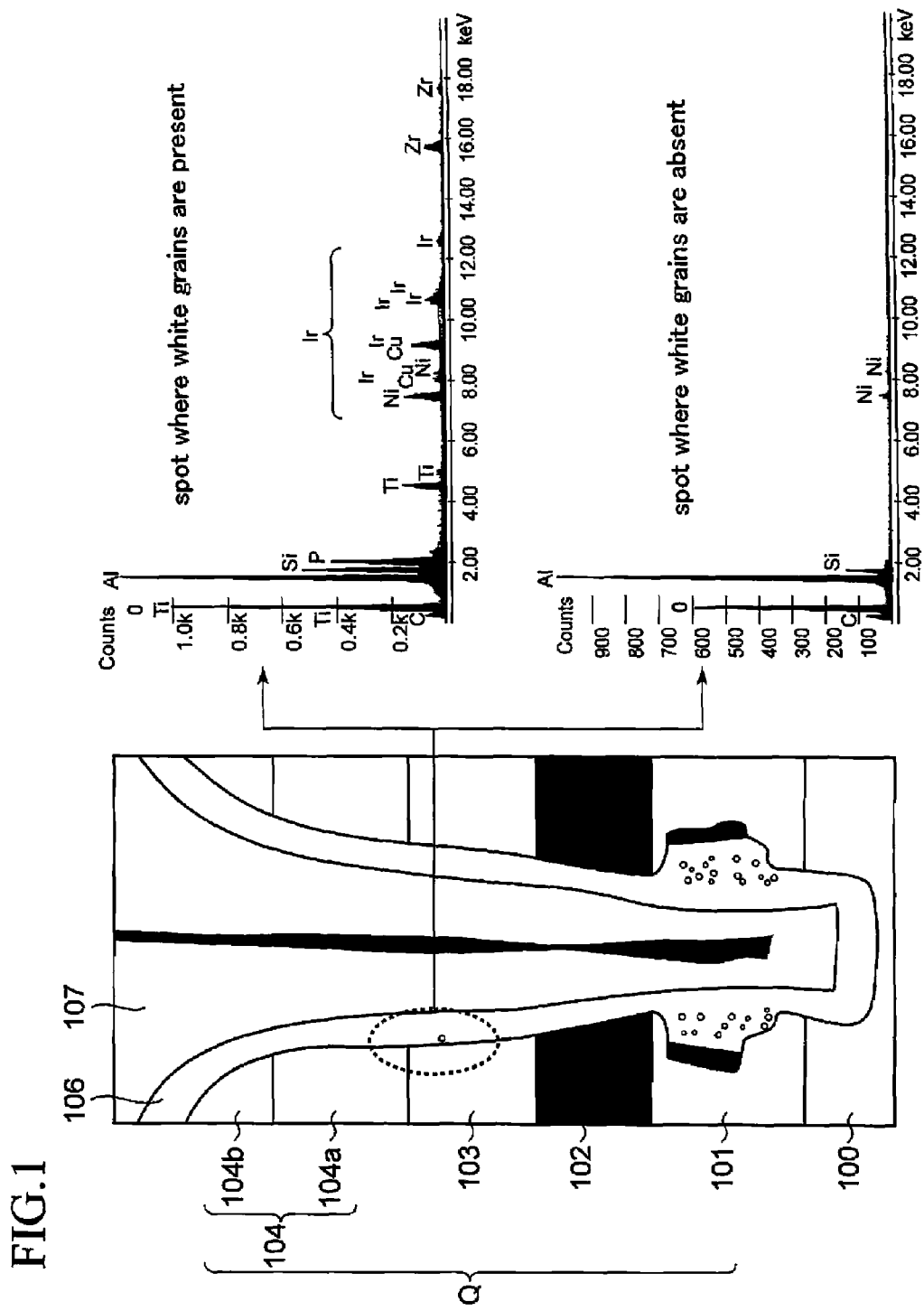
FIG. 1 is a graph (in first) showing a TEM cross-sectional image and EDX of a sample used in the research conducted by the present inventor.

A left side view in FIG. 1 represents an image of TEM (Transmission Electron Microscope) in cross section of a sample used in the analysis.

This sample is comprised of an underlying insulating film 100, made of silicon oxide (SiO$_2$), and a stack type capacitors Q formed on the underlying insulating film 100, with the capacitors Q being shown in FIG. 1 in an expanded scale. The capacitors Q includes a conductive oxygen barrier film 101 made of a titanium aluminum nitride film (TiAlN), a lower electrode 102 made of an iridium film, and a capacitor dielectric film 103 made of PZT.

Further, for an upper electrode 104 of the capacitors Q, a double-layered structure is employed including a conductive metal oxide film 104a, made of iridium oxide, and a conductivity improving film 104b made of an iridium film.

The conductive metal oxide film 104a, made of iridium oxide, has a function to block hydrogen that reduces and deteriorates the capacitor dielectric film 103 from penetrating into the capacitor Q from outside.

Further, the conductivity improving film 104b has a function to decrease contact resistance of a conductive plug (not shown) formed on the upper electrode 104.

Furthermore, the capacitors Q are covered with a capacitor protection insulating film 106, made of alumina having superior hydrogen blocking property, and an interlayer insulating film 107 made of oxide silicon is formed on the capacitor protection insulating film 106.

In this example, the lower electrode 102, the capacitor dielectric film 103 and the upper electrode 104 are formed by simultaneous etching. The capacitors Q, formed by the simultaneous etching, are also referred to as a stack type capacitor that is advantageous in large-scale integration with its small occupying area.

It should be noted that, in addition to the simultaneous etching, such a method is also employed in the mass production process of the capacitor that the lower electrode 102, the capacitor dielectric film 103 and the upper electrode 104 are separately etched to make these films into a step-like shape (see, for example, FIGS. 2 to 12 of Patent Literature 5). Such a capacitor of step-like shape is also referred to as a planar type capacitor.

However, since the planar type capacitor tends to have large occupying area, the planer type capacitor is more disadvantageous than the stack type capacitor in large-scale integration.

Here, according to the research conducted by the present inventor, the stack type capacitors Q, formed by the above simultaneous etching, has leak current between the lower electrode 102 and the upper electrode 104 at a value higher than that of the planar type capacitor in approximately two to three order.

That is, it was turned out that although the stack capacitor Q was advantageous in large-scale integration, there was also room for the stack capacitor Q to decrease the leak current.

In order to find out the reason why the leak current increases in the stack type capacitors Q, inventor of the present application observed the TEM image in detail, and found a large number of white grains present on the side surface of the capacitor dielectric film 103.

Upon inspecting such white grains through the use of an EDX (Energy Dispersive X-ray Fluorescence Spectrometer), a graph was obtained as shown in an upper right area of FIG. 1.

As shown in this graph, a large number of peaks appeared showing the presence of iridium.

For comparison, upon checking an area in which white grains are absent, a graph shown in a lower right area of FIG. 1 is obtained in which no iridium is found to be present.

From such a result, it can be confirmed that the white grains are iridium grains.

It is considered that such iridium grains scatters from an upper surface of the conductivity improving film 104b made of the iridium film, due to exposure to the etching atmosphere during the simultaneous etching to form the capacitor Q.

Since the iridium grains form a leak path in the capacitors Q, it is conceivably effective to decrease the iridium grains for decreasing leak current.

However, since iridium is difficult to be wet-etched as compared with the other platinum group elements, the iridium grains need to be removed without relying on wet etching.

The inventor of the present application also analyzed the white grains deposited on the side surface of the conductive oxygen barrier film 101 by EDX.

Figure 2:
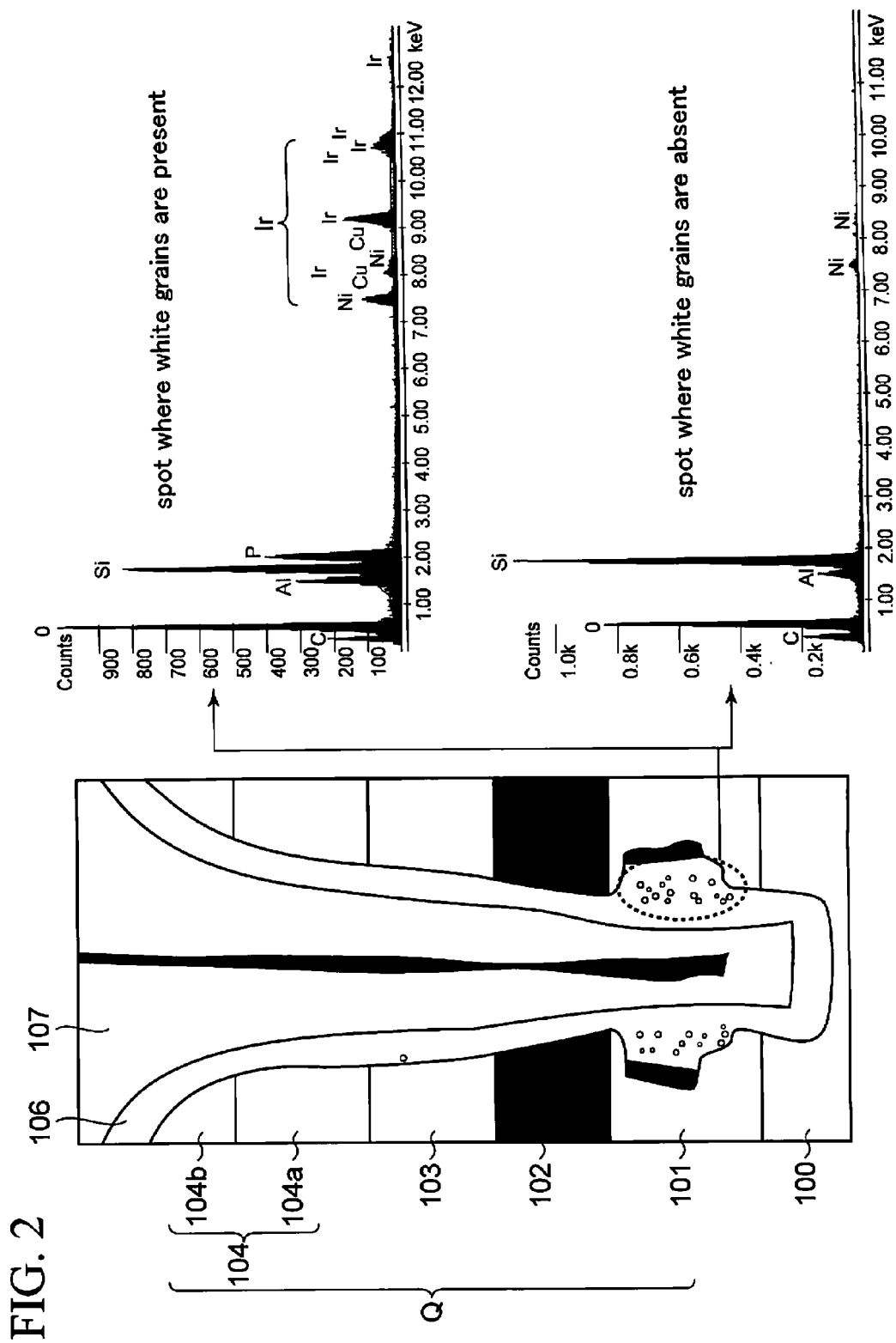
FIG. 2 is a graph (in second) showing a TEM cross-sectional image and EDX of another sample used in the research conducted by the present inventor.

This result is shown in FIG. 2.

A graph in an upper right area of FIG. 2 was obtained upon checking the white grains in the vicinity of the side surface of the conductive oxygen barrier film 101 using EDX. On the other hand, a graph in a lower right area of FIG. 2 was obtained upon checking an area where the white grains are absent.

As will be apparent from comparison between these graphs, iridium peaks appears in the area where the white grains are present, whereas the peaks do not appear in the area where the white grains are absent, which shows that the white grains are iridium grains.

In view of these results, inventor of the present application comes to following embodiments of the present invention.

(2) First Embodiment

Figure 3A:
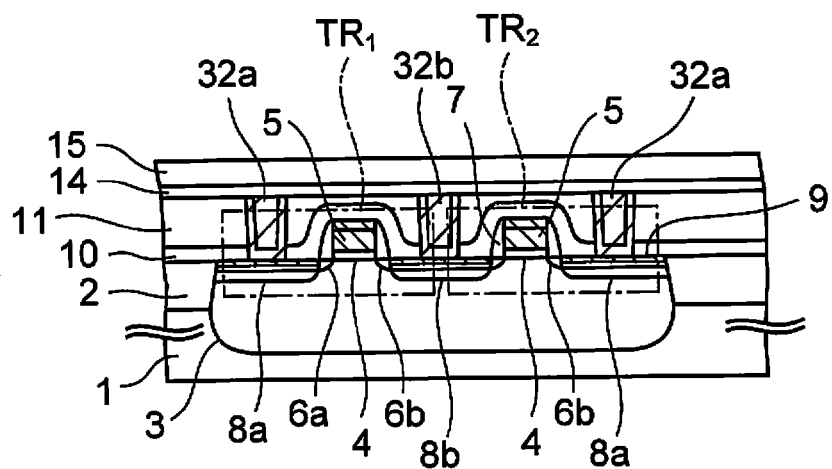
FIGS. 3A to 3W are cross-sectional views showing a semiconductor device of a first embodiment according to the present invention in the course of fabrication thereof.
Figure 3B:
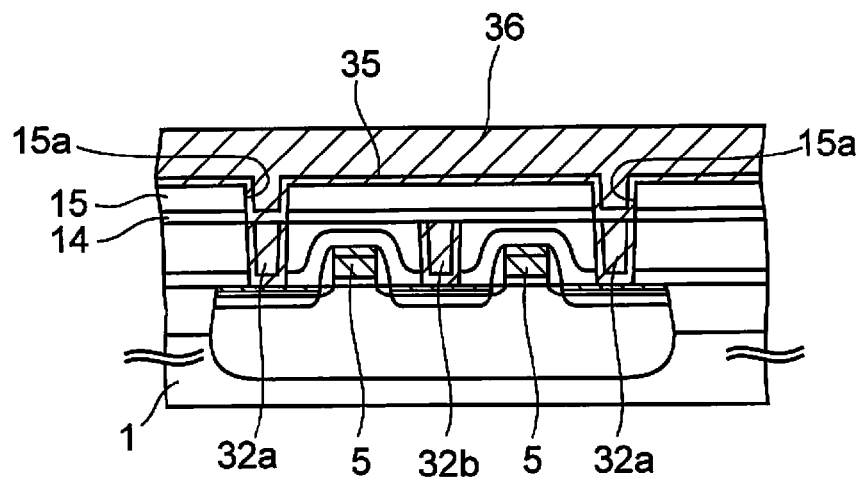
Figure 3C:
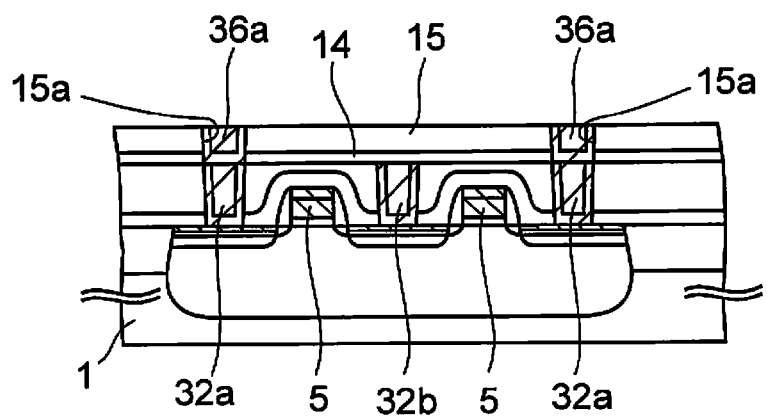
Figure 3D:
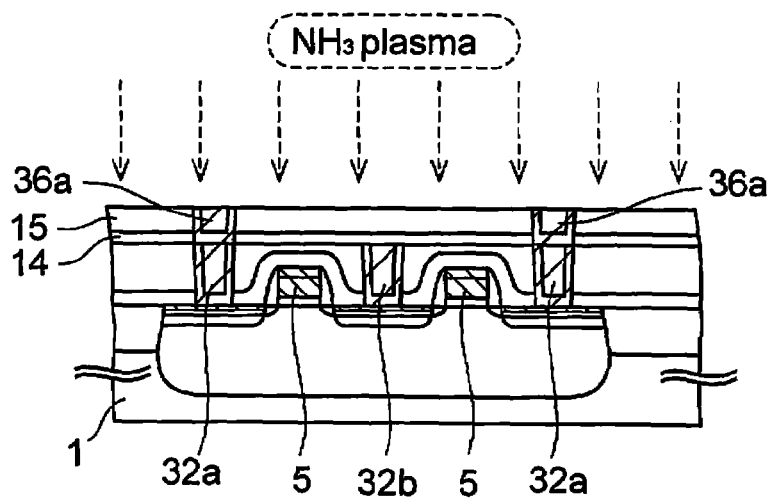
Figure 3E:
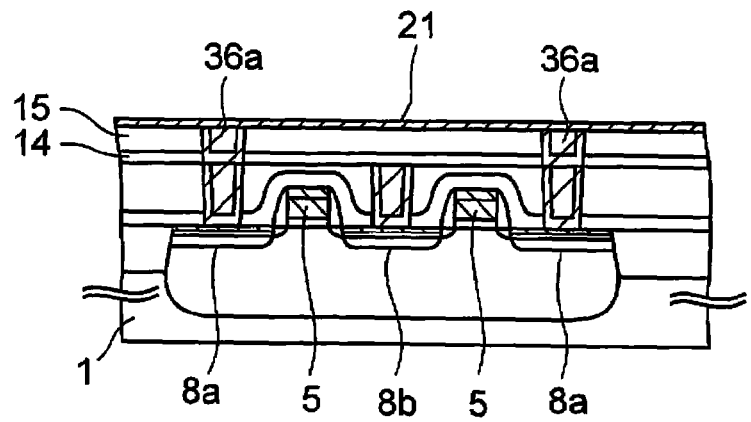
Figure 3F:
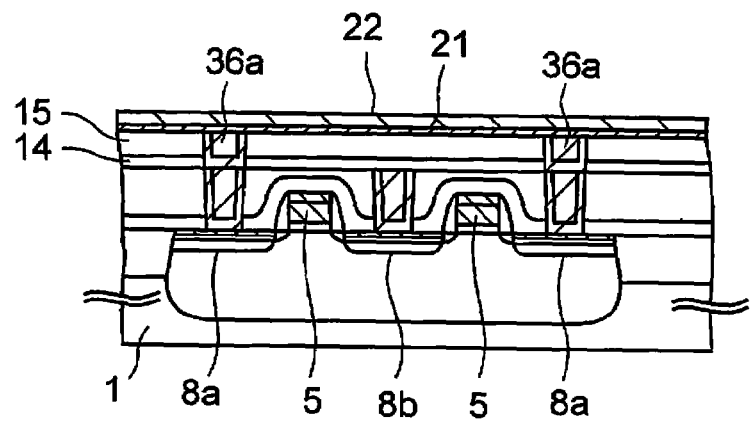
Figure 3G:
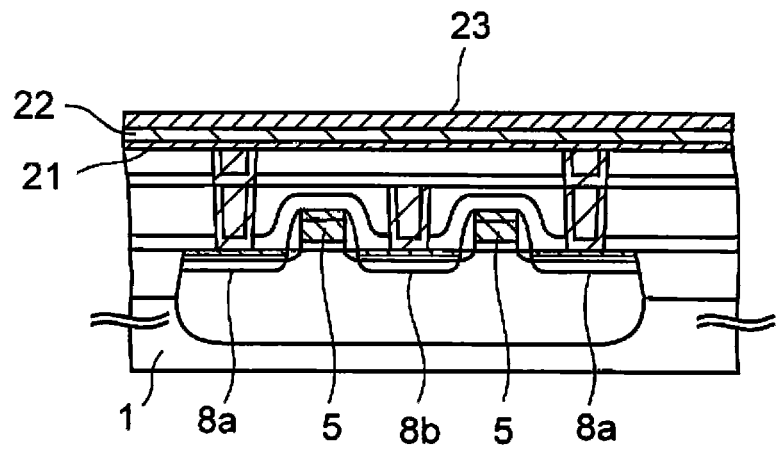
Figure 3H:
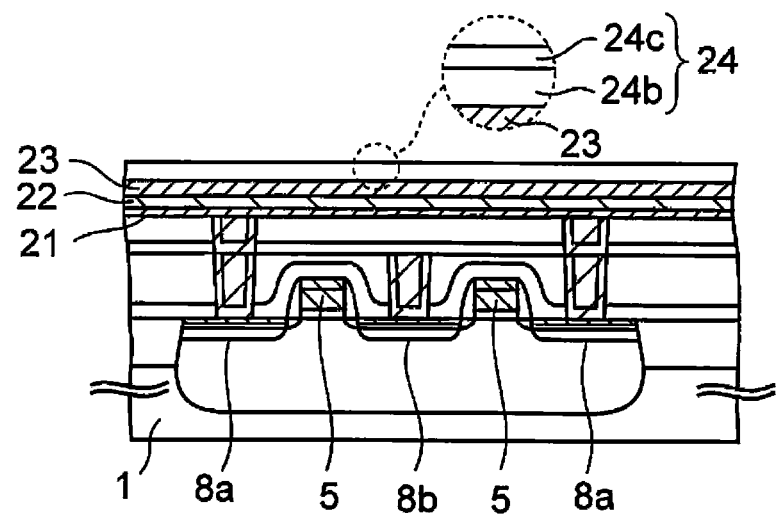
Figure 3I:
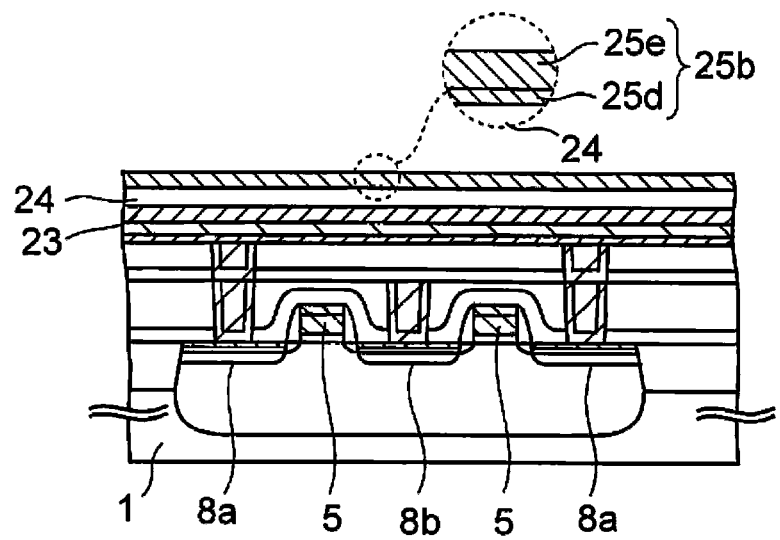
Figure 3J:
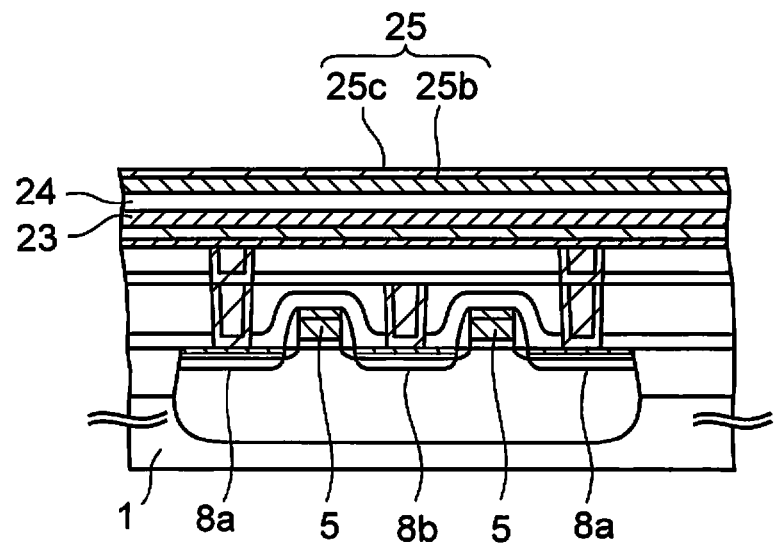
Figure 3K:
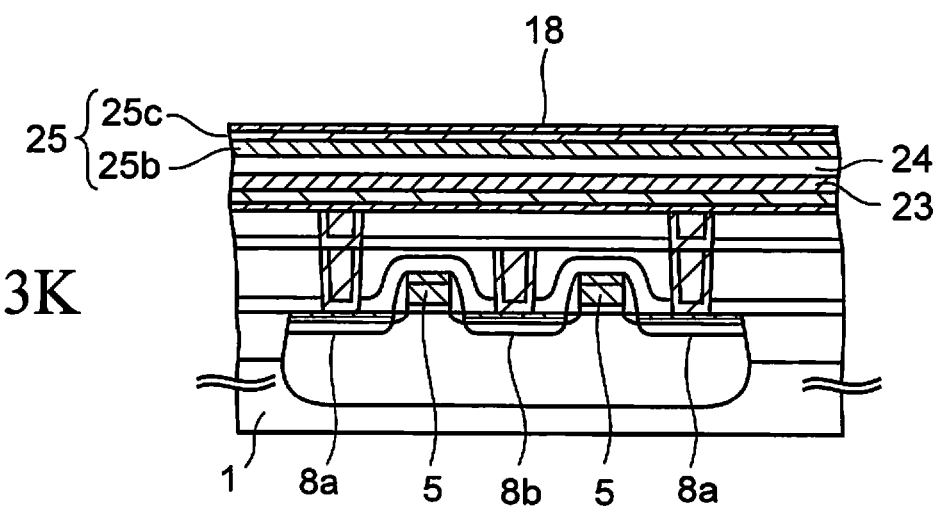
Figure 3L:
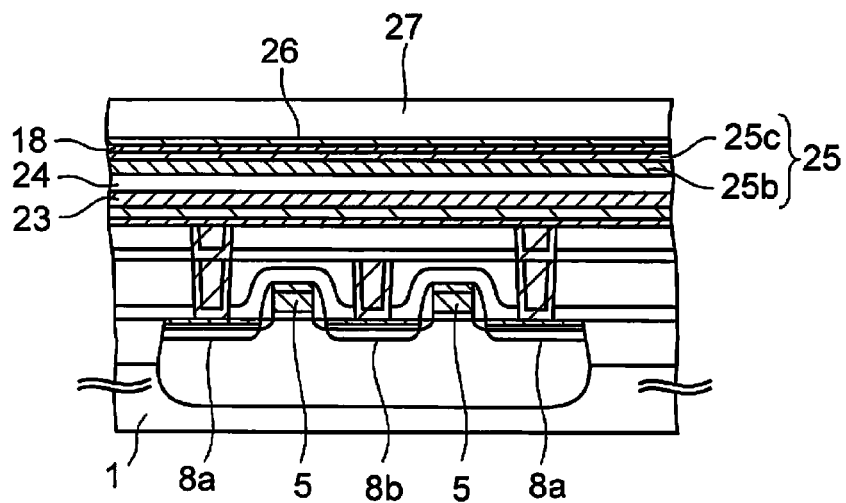
Figure 3M:
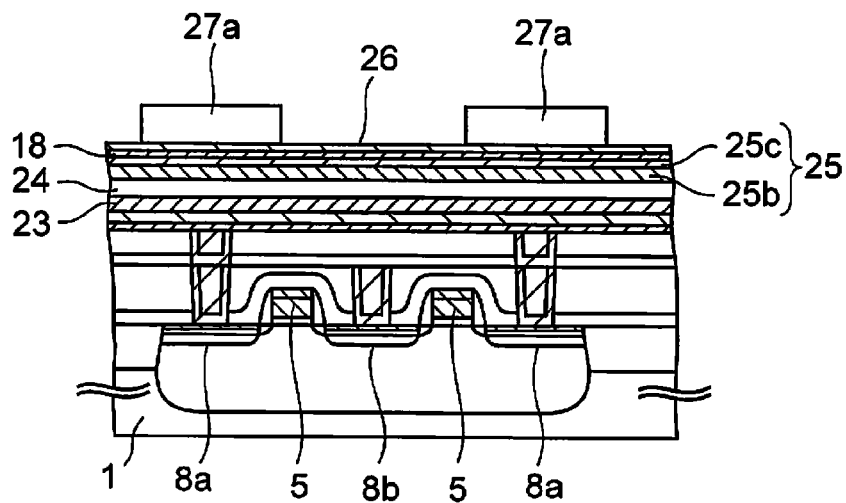
Figure 3N:
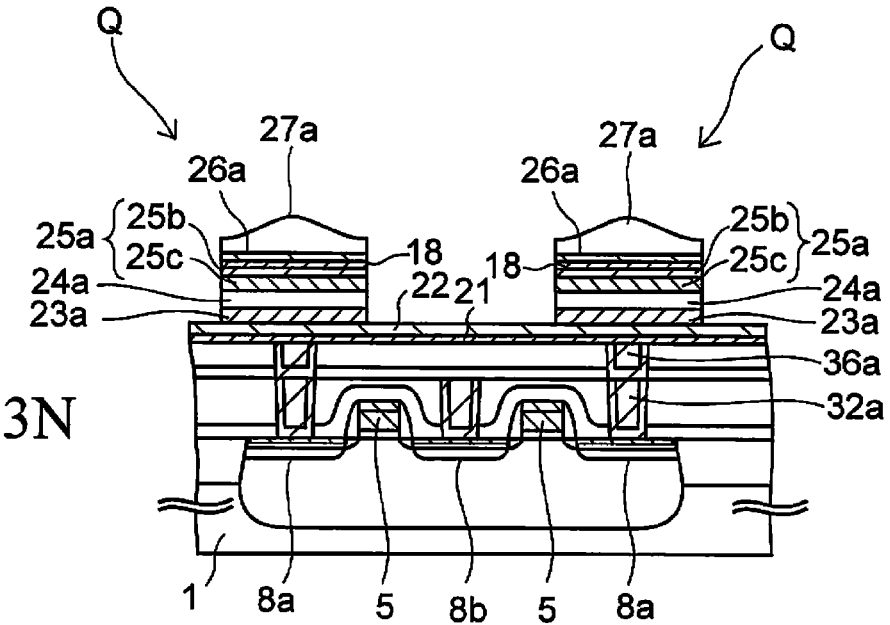
Figure 3O:
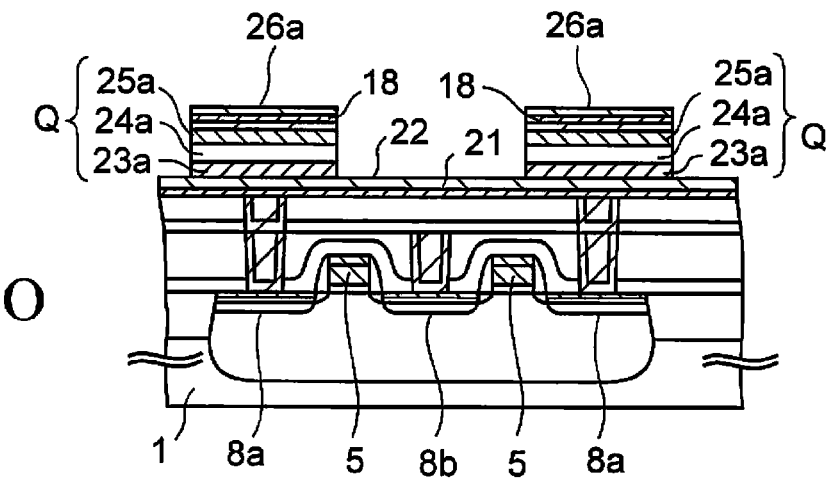
Figure 3P:
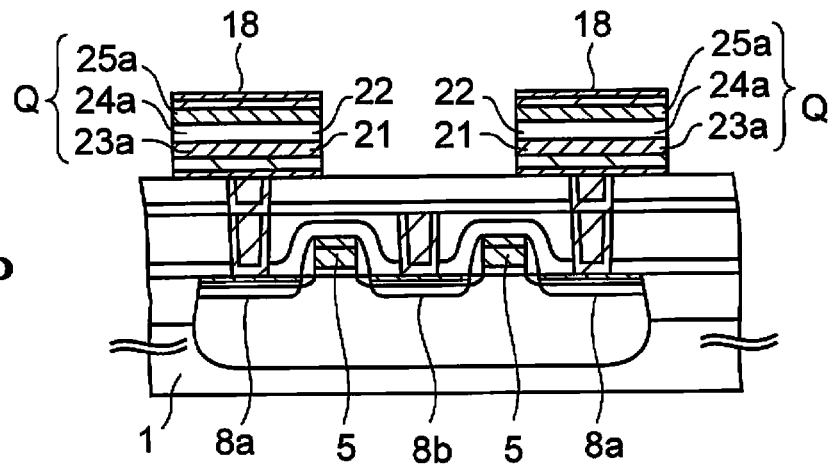
Figure 3Q:
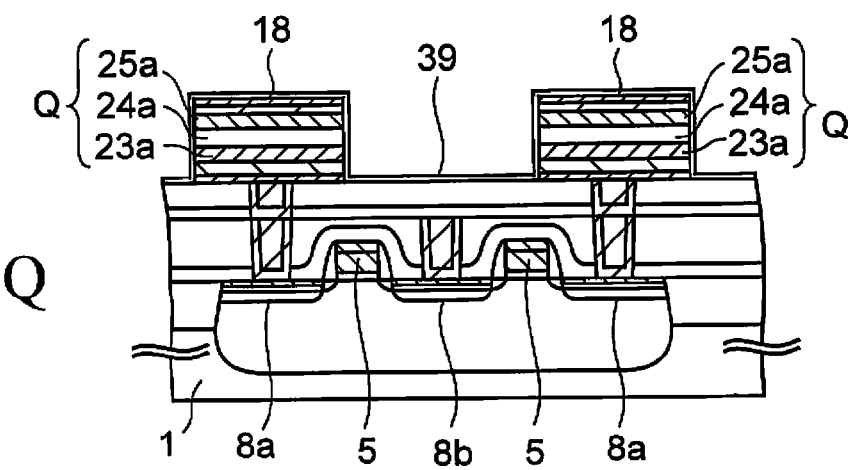
Figure 3R:
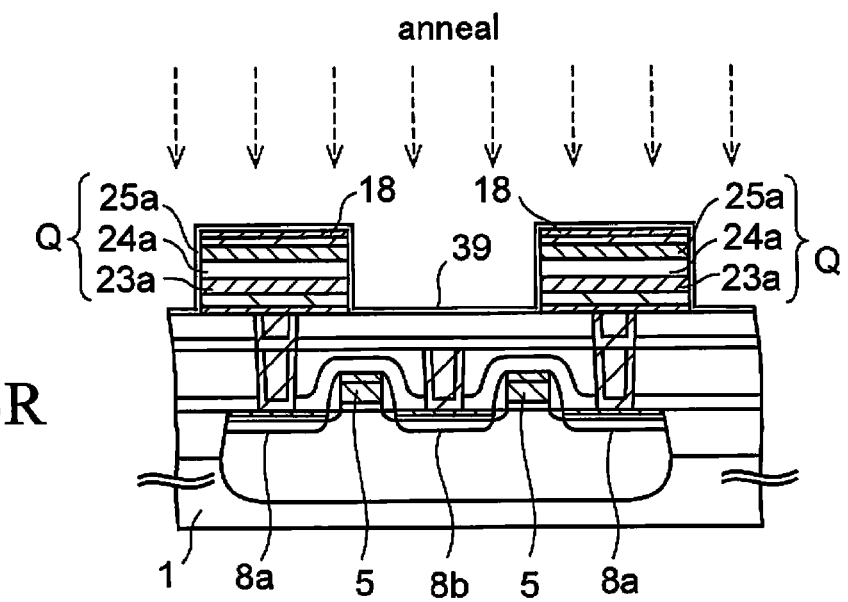
Figure 3S:
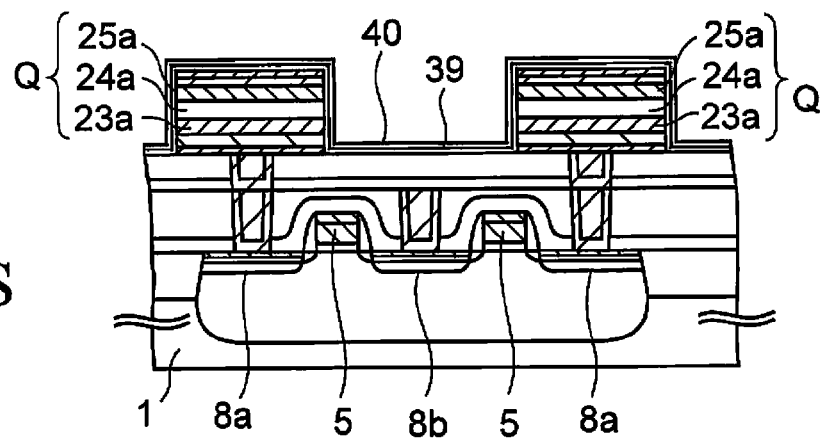
Figure 3T:
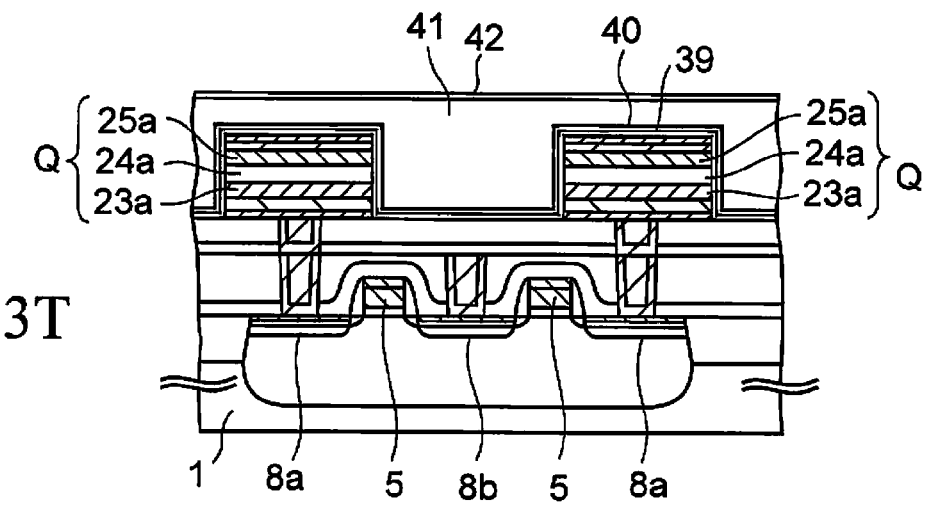
Figure 3U:
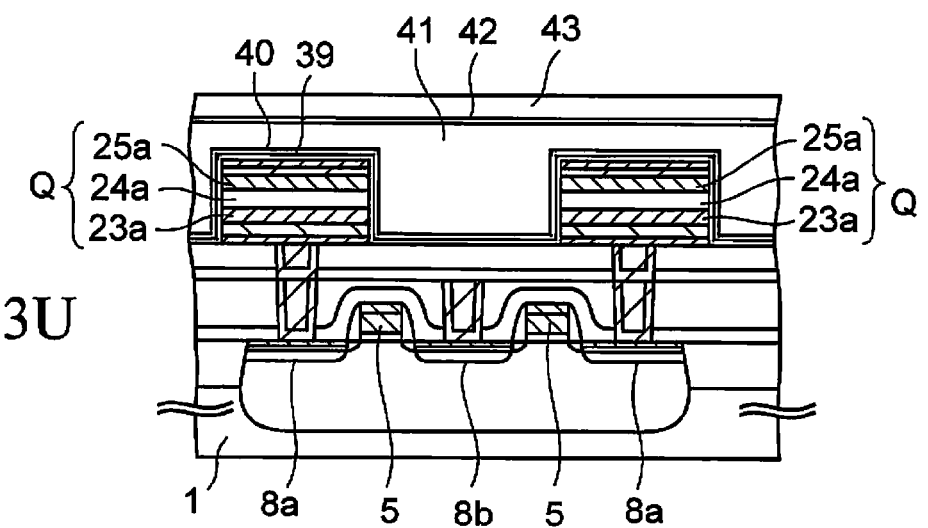
Figure 3V:
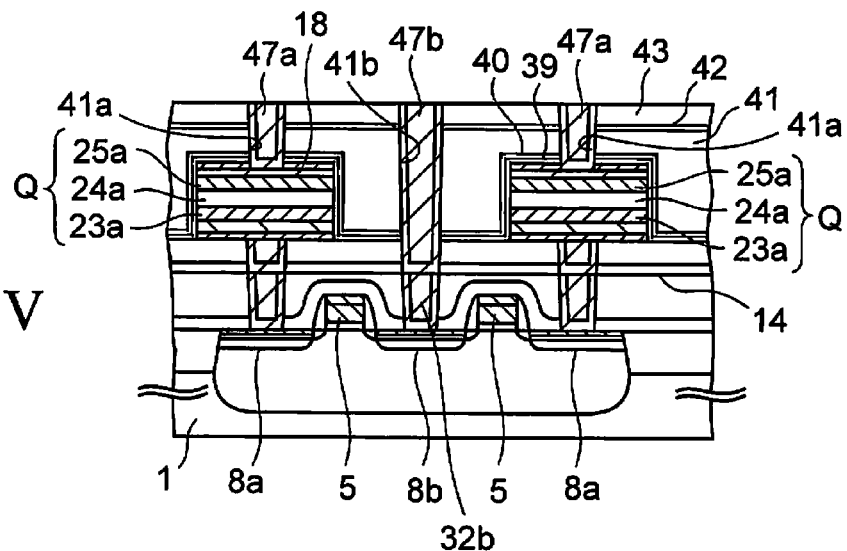
Figure 3W:
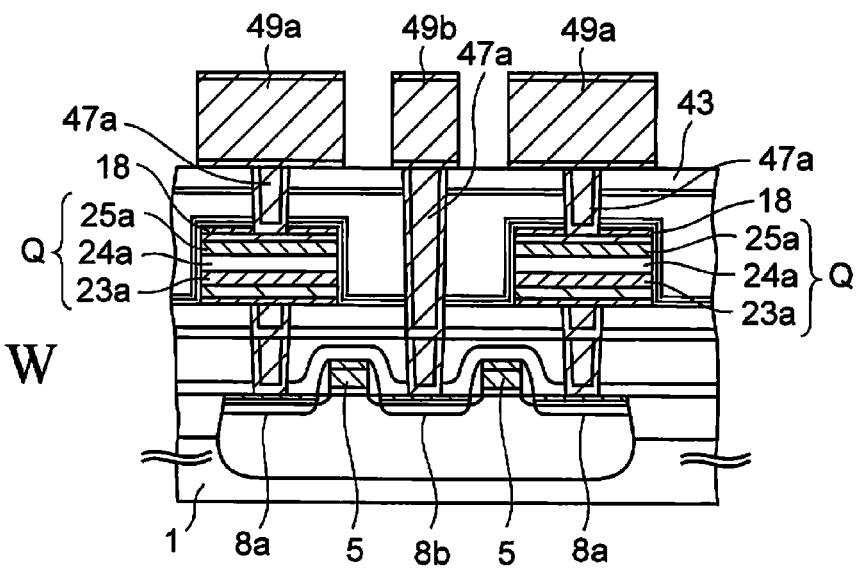

FIGS. 3A to 3W are cross-sectional views showing a semiconductor device of the present embodiment in the course of manufacturing.

This semiconductor device is a stack type FeRAM advantageous in miniaturization, and is manufactured in manner described below.

Firstly, description is made of a process until a cross-sectional structure shown in FIG. 3A is obtained.

First, trenches for STI(Shallow Trench Isolation), which defines active regions of transistors, is formed in a surface of an n-type or p-type silicon (semiconductor) substrate 1. Then, an insulating film such as silicon oxide film is buried in the trenches as an element isolation insulating film 2. Note that the element isolation structure is not limited to the STI. The element isolation insulating film 2 may be formed by a LOCOS (Local Oxidation of Silicon) method.

Next, a p-type impurity is introduced into the active regions of the silicon substrate 1 to form a p-well 3. Then, the surface of the active regions is thermally oxidized to form a thermal oxide film that plays a role of a gate insulating film 4.

Subsequently, an amorphous or polycrystalline silicon film is formed on an overall upper surface of the silicon substrate 1, and patterning is carried for the silicon film using a photolithography to form two gate electrodes 5.

The two gate electrodes 5 formed on the p-well 3 are disposed at a distance from each other in parallel and constitute a part of word lines.

Subsequently, while using the gate electrode 5 as a mask, n-type impurities are introduced into the silicon substrate beside the gate electrode 5 by ion implantation to form first and second source/drain extensions 6a, 6b.

Thereafter, an insulating film is formed on an entire upper surface of the silicon substrate 1, and the insulating film is etched back to form insulating sidewalls 7 on both sides of the gate electrodes 5. For such insulating films, silicon oxide film is formed using a CVD method for example.

Consecutively, ion implantation is carried out again to implant the n-type impurity into the silicon substrate 1 while using the insulating sidewalls 7 and the gate electrodes 5 as masks. This allows first and second source/drain regions (first and second impurity diffusion regions) 8a, 8b to be formed at a distance from each other in a surface layer of the silicon substrate biside the two gate electrodes 5.

With the foregoing steps, first and second MOS transistors $TR_1$, $TR_2$, constructed from the gate insulating film 4, gate electrode 5, and first and second source/drain regions 8a, 8b, are formed in the active regions of the silicon substrate 1.

Next, a refractory metal layer, such as cobalt or the like, is formed on an overall upper surface of the silicon substrate 1 by sputtering method. Thereafter, the refractory metal layer is heated for reaction with silicon to form a refractory metal silicide layer 9 on the silicon substrate 1. The refractory metal silicide layer 9 is also formed on the surface layer of the gate electrodes 5, so that resistances of the gate electrodes 5 are lowered.

Subsequently, the refractory metal silicide layer, remaining unreacted on the upper surface of the element isolation insulating film 2, is removed by wet etching.

Consecutively, a silicon nitride (SiN) film is formed on an overall upper surface of the silicon substrate 1 as a cover insulating film 10 by a plasma CVD method in thickness of approximately 200 nm. Then, a silicon oxide film is formed on the cover insulating film 10 as a first interlayer insulating film 11 in thickness of approximately 1000 nm by the plasma CVD method using TEOS gas.

Next, the upper surface of the first interlayer insulating film 11 is polished and planarized by a CMP (Chemical Mechanical Polishing) method. As a result of CMP, the first interlayer insulating film 11 has a thickness of approximately 700 nm on a flat surface of the silicon substrate 1.

Then, the patterning is conducted for the cover insulating film 10 and the first interlayer insulating film 11 by photolithography to form contact holes having a diameter of 0.25 nm in areas above the first and second source/drain regions 8a, 8b. In addition, a glue film (adhesion film) and a tungsten film are formed in the contact holes in sequence. Subsequently, excess glue film and tungsten film are polished and removed from the first interlayer insulating film 11 by the CMP method, thereby leaving these films only in the contact holes as first and second conductive plugs 32a, 32b.

The first and second conductive plugs 32a, 32b are electrically connected to the first and second source/drain regions 8a, 8b, respectively.

Also, the glue film is made of a titanium film with a thickness of approximately 30 nm and a titanium nitride film with a thickness of approximately 20 nm formed in this order. Moreover, before conducting the CMP, the tungsten film has a thickness of approximately 300 nm on the first interlayer insulating film 11.

Here, the first and second conductive plugs 32a, 32b are mainly composed of tungsten that is liable to be oxidized, and there is a fear of contact failure when oxidized in the process.

Therefore, a silicon oxynitride (SiON) film is formed on the first and second conductive plugs 32a, 32b and the first interlayer insulating film 11 by the plasma CVD method as an oxidation preventing insulating film 14 in thickness of approximately 200 nm for preventing the oxidations of these plugs 32a, 32b.

Also, in place of the silicon oxynitride film, a silicon nitride (SiN) film or an alumina film may be formed as the oxidation preventing insulating film 14.

Thereafter, a silicon oxide film is formed on the oxidation preventing insulating film 14 in thickness of approximately 300 nm by the plasma CVD method using TEOS gas as an underlying insulating film 15.

Next, description is made of a process until a cross-sectional structure shown in FIG. 3B is obtained.

First, underlying insulating film 15 and the oxidation preventing insulating film 14 is patterned, and first holes 15a are formed in these insulating films over the first conductive plug 32a.

Next, a titanium nitride film is formed in the first holes 15a and on the underlying insulating film 15 as a glue film 35 by a sputtering method.

Further, a tungsten film is formed on the glue film 35 as a conductive plug film 36 using the CVD method, thereby burying the first holes 15a completely with the conductive plug film 36.

Subsequently, as shown in FIG. 3C, excess glue film 35 and conductive plug film 36 on the underlying insulating film 15 are polished and removed by the CMP method. This allows the glue film 35 and the conductive plug film 36 to remain in the first holes 15a as second conductive plugs 36a in electrical connection with the first conductive plugs 32a.

In this CMP, slurry such as, for instance, W2000 made by Cabot Microelectronics Corporation, is employed to allow the glue film 35 and the conductive plug film 36 to be polished at a higher speed than that at which the underlying insulating film 15 is polished. In order not to leave unpolished residual films on the underlying insulating film 15, polishing amount in this CMP is set to be thicker than the total thickness of the films 35, 36, so that the CMP is performed under the condition of over polishing.

Next, as shown in FIG. 3D, the underlying insulating film 15, made of silicon oxide, is exposed to nitrogen containing plasma such as, for instance, ammonia ($NH_3$) plasma, so that NH groups are made bonded to oxygen atoms on the surface of the underlying insulating film 15.

In this ammonia plasma process, a parallel plate type plasma processing equipment that has an opposing electrode placed from the silicon substrate 1 by a distance of approximately 9 mm (350 mils) is used. With a substrate temperature kept at 400° C. under a pressure of 266 Pa (2 Torr), ammonia gas is supplied to a chamber at a flow rate of 350 sccm in the process. Furthermore, the silicon substrate 1 is supplied with high-frequency power with a frequency of 13.56 MHz at a power of 100 W and the opposing electrode are supplied with high-frequency power of 350 kHz at a power of 55 W for 60 seconds to perform the process.

Subsequently, as shown in FIG. 3E, a titanium film is formed on the underlying insulating film 15 and the conductive plugs 36a as a crystalline conductive film 21 in thickness of approximately 20 nm.

Although the deposition condition for the crystalline conductive film 21 is not particularly limited, a sputtering chamber is used in the present embodiment. In this sputtering chamber, distance between the silicon substrate 1 and a titanium target is set to 60 mm. Substrate temperature is set to 20° C. in an argon atmosphere of 0.15 Pa in the chamber. Then, the chamber is supplied with DC power at a power of 2.6 kW for 5 seconds, thereby forming the crystalline conductive film 21 made of titanium.

Here, since ammonium plasma process (see FIG. 3D) is preliminarily conducted and the NH groups are bonded to the oxygen atoms on the surface of the underlying insulating film 15, the titanium atoms deposited on the underlying insulating film 15 become hard to be captured by the oxygen atoms on the surface of the underlying insulating film 15. Therefore, the titanium atoms can freely move on the surface of the underlying insulating film 15, making it possible to form the crystalline conductive film 21, made of titanium, which is intensively self-oriented in a (002) direction.

Thereafter, the underlying insulating film is subjected to RTA (Rapid Thermal Annealing) under nitrogen atmosphere at a substrate temperature of 650° C. for 60 seconds. The crystalline conductive film 21, made of titanium, is nitrided by this process, and the crystalline conductive film 21 is made to be constructed from titanium nitride polarized in a (111) direction.

Then, as shown in FIG. 3F, a titanium aluminum nitride film (TiAlN) is formed on the crystalline conductive film 21 as a conductive oxygen barrier film 22 by a reactive sputtering method to a thickness of 100 nm.

The conductive oxygen barrier film 22, made of titanium aluminum nitride, is excellent in an oxygen permeation preventing function and plays a role as a barrier to prevent the underlying third conductive plugs 36a from being oxidized followed by contact failure.

Although the deposition condition for the conductive oxygen barrier film 22 is not particularly limited, an alloy target made of titanium and aluminum is used, and a gas mixture of argon gas and nitride gas is used as a sputtering gas in the present embodiment. The conductive oxygen barrier film 22 is formed at flow rates of argon gas and nitrogen gas of 40 sccm and 100 sccm respectively, while keeping the substrate temperature at 400° C. under a pressure equal to lower than 253.3 Pa with a sputtering power of 1.0 kW.

Next, as shown in FIG. 3G, an iridium film is formed on the conductive oxygen barrier films 22 as a first conductive film 23 by sputtering in thickness of approximately 100 nm. The formation of the iridium film is executed under argon atmosphere at pressure of, for instance, 0.11 Pa with a substrate temperature of 400° C. at a sputtering power of 0.5 kW.

Here, as set forth above, since the titanium nitride film, constituting the crystalline conductive film 21, is polarized in the (111) direction, the first conductive film 23 has favorable crystallization due to action of such polarization.

Also, the first conductive film 23 is not limited to the iridium film. For the first conductive film 23, any one of an iridium film, a ruthenium film, a rhodium film and palladium film may be formed.

Then, a hard mask (not shown), made of alumina, is formed on the first conductive film 23 in an area recessed from an edge of the silicon substrate 1 by a distance of approximately 3.5 mm. Then, by using this hard mask as an etching mask, the first conductive film 23 is subjected to dry etching to remove the portions of first conductive film 23 residing within 3.5 mm from the edge of the silicon substrate 1.

Then, after removing the hard mask by dry etching, RTA is conducted for the first conductive film 23 under the substrate temperature above 650° C. in argon atmosphere for 60 seconds. Such RTA can improve adhesion between the first conductive film 23 and the conductive oxygen barrier film 22, and improve crystallization of the first conductive film 23.

Also, the first conductive film 23 is not limited to the iridium film. In place of the iridium film, the first conductive film 23 may be formed of metal of platinum group such as platinum or conductive oxide made of PtO, IrOx, $SrRuO_2$, etc.

In addition, the first conductive film 23 may be formed of a stack film of the above metals or metal oxide.

Subsequently, as shown in FIG. 3H, a PZT (Lead Zirconate Titanate: $PbZrTiO_2$) of a perovskite structure is formed on the first conductive film 23 as a first ferroelectric film 24b by an MOCVD method. Since the first ferroelectric film 24b formed by the MOCVD method is already crystallized at the time of the formation of the film, crystallization annealing is not required for crystallizing the first ferroelectric film 24b.

The MOCVD method is carried out in a manner described below.

First, $Pb(DPM)_2$ ($Pb(C_{11}H_{19}O_2)_2$ in Chemical Formula), $Zr(dmhd)_4$ ($Zr(C_9H_{15}O_2)_4$ in Chemical Formula) and Ti(O-iOr)$_2$(DPM)$_2$ ($Ti(C_3H_7O)_2(C_{11}H_{19}O_2)_2$ in Chemical Formula) are dissolved in a solvent of THF (Tetra Hydro Furan: $C_4H_8O$) at concentrations of 0.3 mol/l respectively, thereby preparing respective liquid materials of Pb, Zr and Ti. Then, these liquid materials are supplied to an evaporator of an MOCVD equipment at flow rates of 0.326 ml/min, 0.200 ml/min and 0.200 ml/min respectively to evaporate these liquid materials, so that raw material gases of Pb, Zr and Ti are obtained. Additionally, the evaporator is also supplied with a THF solvent at a flow rate of 0.474 ml/min together with the above liquid materials.

Further, while supplying the above raw material gases to the chamber, pressure in the chamber is kept at a pressure of 665 Pa (5 Torr) and the substrate temperature is kept at 620° C. Then, such a condition is maintained for 620 seconds and the above PZT film is formed in thickness of 100 nm.

Furthermore, the first ferroelectric film 24b is not limited to the PZT film. The first ferroelectric film 24b may be formed of PZT in which at least one of lanthanum, calcium, strontium and silicon is doped. Moreover, the first ferroelectric film 24b may be formed of a Bi-layered structure compounds such as $(Bi_{1-x}R_x)Ti_3O_{12}$ (where R represents rare earth element and $0<x<1$), $SrBi_2Ta_2O_9$ and?$SrBi_4Ti_4O_{15}$, etc.

Further, in place of ferroelectric material, the first ferroelectric film 24b may be formed of high ferroelectric material of metal oxide containing zirconium or lead.

Here, as set forth above, the first conductive film 23 has a favorable crystal structure due to the action of the crystalline conductive film 21 made of titanium nitride polarized in (111) direction. Therefore, the first ferroelectric film 24b, formed on the first conductive film 23, is made to have a favorable crystalline structure, so that the ferroelectric characteristic of the first ferroelectric film 24b, such as remanent polarization charge, can be improved.

Next, a PZT film is formed on the first ferroelectric film 24b as a second ferroelectric film 24c by the sputtering method in thickness of 1 to 30 nm such as, for instance, 20 nm, and the first and second ferroelectric films 24b, 24c is used as a ferroelectric film 24.

It should be noted that, in contrast to the first ferroelectric film 24b formed by the MOCVD method, the second ferroelectric film 24c formed by the sputtering method is not crystallized at the time of film formation and remains in an amorphous state.

Note that the second ferroelectric film 24c is not limited to PZT.

The second ferroelectric film 24c may be formed of ferroelectric material having an $ABO_3$ type perovskite structure (A=any one of Bi, Pb, Ba, Sr, Ca, Na, K and rare earth elements and B=any one of Ti, Zr, Nb, Ta, W, Mn, Fe, Co and Cr) like PZT.

Further, the second ferroelectric film 24c may be formed of PZT in which at least one of lanthanum, calcium, strontium and silicon is doped. Doping these elements in the PZT film results in improvements in fatigue loss and imprint characteristic of the second ferroelectric film 24c, while lowering write/read voltages applied to the capacitor.

Furthermore, the second ferroelectric film 24c may be formed of the Bi-layered structure compounds such as $(Bi_{1-x}R_x)Ti_3O_{12}$ (where R represents rare earth element and $0<x<1$?), $SrBi_2Ta_2O_9$ and?$SrBi_4Ti_4O_{15}$, etc.

Moreover, the deposition method for the second ferroelectric film 24c is not limited to the sputtering method. The second ferroelectric film 24c may be formed by a sol-gel method or an MOCVD method. In adopting the MOCVD method, the same deposition condition as in the first ferroelectric film 24b can be employed.

However, for a reason described below, the second ferroelectric film 24c may preferably be a film of amorphous state or fine crystal. It is therefore most preferable that the sputtering method is employed, because sputtering method can form amorphous second ferroelectric film 24c.

Subsequently, as shown in FIG. 3I, an iridium oxide ($IrO_x$) film is formed on the ferroelectric film 24 as a first conductive metal oxide film 25d by a reactive sputtering method in thickness of approximately 50 nm while heating the silicon substrate 1. It should be noted that the iridium oxide ($IrO_x$) film, formed by the sputtering method with the silicon substrate 1 being heated in this way, is already crystallized at the time of film formation even if a process for crystallization is not performed.

A deposition condition for the first conductive metal oxide film 25d is not particularly limited. In the present embodiment, the substrate temperature is kept at 300° C. and sputtering is carried out using gas mixture containing argon gas with a flow rate of 140 sccm and oxygen gas with a flow rate of 10 sccm to 90 sccm, for instance 60 sccm, as sputtering gas, with sputtering power being set to 1 kW to 2 kW.

Here, in the sputtering process of iridium oxide, iridium atoms coming from an iridium target are oxidized in a sputtering atmosphere and iridium oxide is deposited on the substrate. Therefore, deposited iridium oxides contain some iridium atoms that undergo insufficient oxidation in the sputtering atmosphere. As such, the iridium oxide film, as a whole, tends to be in the state where the oxygen content is less than that in the stoicheiometric composition ($IrO_2$).

Therefore, while x1 equals to 2 for stoicheiometric composition $IrO_{x1}$ of the iridium oxide, x2 equals to 1.3 to 1.4 for the actual iridium oxide $IrO_{x2}$ constituting the first conductive metal oxide film 25d formed under the above mentioned condition. Thus, ratio x2/x2 becomes significantly less than 1.

Here, the first ferroelectric film 24b is likely to be damaged due to sputtering gas when forming the second ferroelectric film 24c and the first conductive metal oxide film 25d by the sputtering method, so that the oxygen deficiency can occur in the first ferroelectric film 24b and thus the ferroelectric characteristics of the first ferroelectric film 24b may be deteriorated.

Therefore, the first ferroelectric film 24b is subjected to RTA in an oxidative gas containing atmosphere such as gas mixture of argon and oxygen after forming the first conductive metal oxide film 25d, thereby recovering the damage of the first ferroelectric film 24b, as well as compensating the oxygen deficiency of the first ferroelectric film 24b.

Although the condition of the RTA is not particularly limited, it is preferable that the substrate temperature is equal to or more than 650° C., more preferably 700° C. to 750° C. In the present embodiment, the substrate temperature is set to 725° C. Also, the flow rates of argon and oxygen are set to 2000 sccm and 20 sccm respectively, and a processing time is set to 60 seconds.

Moreover, an atmosphere for RTA is not particularly limited provided that the atmosphere is gas mixture of inert gas and oxidative gas. Of these, for inert gas, any one of argon, nitrogen ($N_2$) and nitrogen dioxide ($N_2O$) may be adopted.

Figure 4A:
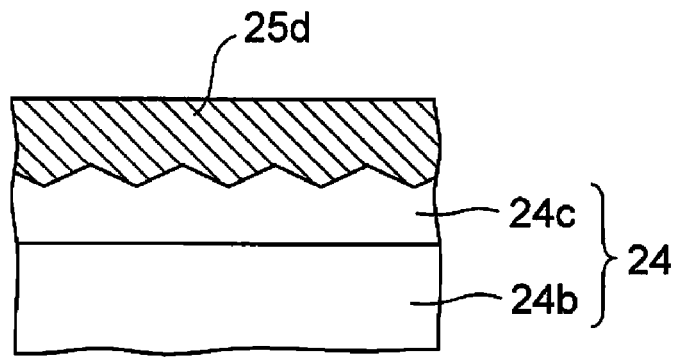
FIG. 4A is an enlarged cross-sectional view of an interface area between a first conductive metal oxide film and a ferroelectric film prior to conducting RTA on the first conductive metal oxide film.
Figure 4B:
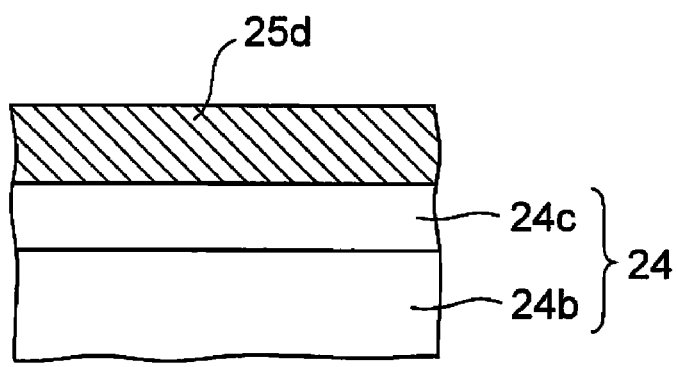
FIG. 4B is an enlarged cross-sectional view of an interface area between the first conductive metal oxide film and the ferroelectric film upon conducting RTA on the first conductive metal oxide film.

FIG. 4A is an enlarged cross-sectional view of an area in the vicinity of an interface between the first conductive metal oxide film 25d and the ferroelectric film 24, and FIG. 4B is an enlarged cross-sectional view showing the same area after the annealing.

As shown in FIG. 4A, since the first conductive metal oxide film 25d is crystallized at the time of its formation, unevenness reflecting the crystalline grains is appeared in the interface between the first conductive metal oxide film 25d and the second ferroelectric film 24c.

On the contrary, after the execution of RTA, unevenness is disappeared, and the interface between the first conductive metal oxide film 25d and the second ferroelectric film 24c is made flattened as shown in FIG. 4B.

Being flattened in this way, a large proportion of a voltage applied to a capacitor can be imparted to the ferroelectric film 24, making it possible to obtain such an advantage that the capacitor can operate with low voltage. Thus, the first conductive metal oxide film 25d plays a role of flattening the interface between the first conductive metal oxide film 25d and the second ferroelectric film 24c.

On the contrary, if the unevenness remains appeared in the above interface, a voltage drop increases at the interface. Therefore, net voltage applied to the ferroelectric film 24 is lowered, and a switching charge Qsw of the capacitor decreases. For this reason, a high voltage needs to be applied for writing/reading operation of the capacitor. This has a disadvantage in lowering the operating voltage of the capacitor. However, in the case where the voltage is not required to be lowered, the above RTA may be omitted.

Additionally, since the second ferroelectric film 24c is formed in amorphous state, iridium atoms diffusing from the first conductive metal oxide film 25d into the ferroelectric film 24 by this RTA stay within the second ferroelectric film 24c and are made to be difficult to reach the first ferroelectric film 24b. As a result, iridium becomes hard to diffuse into a grain boundary of the first ferroelectric film 24b having an excellent ferroelectric characteristic upon crystallization and, hence, the formation of a leakage path due to iridium can be suppressed, thereby making it possible to effectively preventing the occurrence of leakage current of the ferroelectric capacitor.

Such an advantage is also obtained with the second ferroelectric film 24c made of fine crystal.

Reference is made to FIG. 3I again.

After the first conductive metal oxide film 25d is formed in such a way described above, an iridium oxide film is formed on the first conductive metal oxide film 25d in thickness of approximately 100 to 300 nm, for instance, 200 nm as a second conductive metal oxide film 25e using a reactive sputtering method with the substrate temperature set to a room temperature. The second conductive metal oxide film 25e is formed under a sputtering atmosphere with a pressure of 0.8 Pa at a sputtering power of 1.0 kW for a deposition time of 79 seconds.

Here, in contrast to the first conductive metal oxide film 25d crystallized at the high deposition temperature, the second conductive metal oxide film 25e formed in the sputtering method with the substrate temperature set to the room temperature becomes an amorphous state.

By the way, if the second conductive metal oxide film 25e lacks oxygen, the second conductive metal oxide film 25e has increased catalytic action.

Therefore, if outside moisture is brought into contact with the second conductive metal oxide film 25e, hydrogen is generated. Since hydrogen reduces the ferroelectric film 24 and deteriorates its ferroelectric characteristic, need exists in FeRAM process to suppress the generation of hydrogen as possible.

Accordingly, from a viewpoint of preventing the generation of hydrogen, the oxidation number of iridium constituting the second conductive metal oxide film 25e is preferably selected to be greater than that of the first conductive metal oxide film 25d.

Therefore, in the present embodiment, the composition of iridium oxide is made to be close to stoicheiometric composition ($IrO_2$) by increasing the flow rate ratio of oxygen in the sputtering gas used for forming the second conductive metal oxide film 25e than that for forming the first conductive metal oxide film 25d, which in turn suppresses catalytic action of the second conductive metal oxide film 25e. The flow rate of sputtering gas for such formation is set to, for instance, 100 sccm for argon and 100 sccm for oxygen.

Writing the chemical formula of iridium oxide constituting the second conductive metal oxide 25e as $IrO_{y2}$, y2 become equal to about 2 when the above deposition condition is employed. Since y1 is equal to 2 for $IrO_{y1}$ of stoicheiometric composition of iridium oxide, ratio y2/y1 takes a value closer to 1, and hence inequality y2/y1>x2/x1 holds for ratio x2/x2 of the first conductive metal oxide film 25d.

Thus, the second conductive metal oxide film 25e and the first conductive metal oxide film 25d constitute a conductive metal oxide film 25b as shown in the drawing.

The first conductive metal oxide film 25d has a function to block hydrogen by the action of oxygen in the film and also plays a role as a layer to protect the capacitor dielectric film 24 from hydrogen.

It should be noted that the constituent materials of the first and second conductive metal oxide films 25d, 25e are not limited to iridium oxide.

However, if oxide films of platinum are employed as the first and second conductive metal oxide films 25d, 25e when forming the first ferroelectric film 24b by the MOCVD method, reaction takes place between platinum and lead in the PZT of the ferroelectric film 24. This deteriorates the ferroelectric characteristic of the ferroelectric film 24, resulting in a reduction of the switching charge. Therefore, in such a case, the constituent materials of the first and second conductive metal oxide films 25d, 25e may preferably be any one of oxides of iridium (Ir), ruthenium (Ru), rhodium (Rh), rhenium (Re), osmium (Os) and palladium (Pd).

Further, as set forth above, for the purpose of preventing the generation of hydrogen in the second conductive metal oxide film 25e, metal oxide constituting the second conductive metal oxide film 25e may be preferably oxidized at a higher rate than that in the first conductive metal oxide film 25d. Let stoicheiometric compositions of metal oxides constituting the first and second conductive metal oxide films 25d, 25e be $AO_{x1}$, $BO_{y1}$ (where A and B represent metallic elements) respectively, and actual compositions after the film formation of these metal oxides be $AO_{x2}$, $BO_{y2}$ then the above condition can be expressed as y2/y1>x2/x1.

Further, with regard to the thickness of the first and second conductive metal oxide films 25d, 25e, it is preferable that the first conductive metal oxide film 25d is thinner than the second conductive metal oxide film 25e This is because during the above-described RTA executed after the formation of the first conductive metal oxide film 25d, oxygen tends to easily spread into a whole of the ferroelectric film 24, so that the ferroelectric film 24 can be effectively recovered from damage, if the first conductive metal oxide film is formed thinner. Additionally, since the second conductive metal oxide film 25e plays a role of blocking the reducing substances, such as moisture and hydrogen or the like, generating from a second interlayer insulating film that is subsequently formed, blocking capability against the reducing substances can be enhanced if the second conductive metal oxide film 25e is formed thicker.

Furthermore, from the viewpoint of easily flattening the interface between the first conductive metal oxide film 25d and the second ferroelectric film 24c, the first conductive metal oxide film 25d may preferably be formed thinner.

Moreover, after the second conductive metal oxide film 25e is formed, RTA may be carried out for the second conductive metal oxide film 25e in an atmosphere containing oxidative gas. This RTA is carried out at a substrate temperature of approximately 700° C. in the gas mixture of argon and oxygen for about 1 minute, for example.

By the RTA executed in such a way, the second conductive metal oxide film 25e is compensated with oxygen, and the amorphous second conductive metal oxide film 25e is crystallized.

In the case where this RTA is omitted, the second conductive metal oxide film 25e is heated into crystallized during a process in which another film is formed on the second conductive metal oxide film 25e. Such a process may include a step of forming a hard mask that will be described later. However, oxygen escapes from the second conductive metal oxide film 25e during crystallization, so that voids are formed in the second conductive metal oxide film 25e. These voids are not favorable, because they deteriorate an upper electrode constructed from the second conductive metal oxide film 25e explained below.

Therefore, in order to obtain the upper electrode with fine quality, RTA may be preferably performed for the second conductive metal oxide film 25e in an atmosphere containing oxidative gas under a condition where an upper surface of the second conductive metal oxide film 25e is exposed in a manner described above.

However, if the film quality of the upper electrode is immaterial, such annealing may be omitted.

Subsequently, as shown in FIG. 3J, an iridium film is formed on the conductive metal oxide film 25b as a conductivity improving film 25c in thickness of 50 nm by sputtering. This sputtering is carried out in an atmosphere of argon with a pressure of 1 Pa, and sputtering power of 1.0 kW is applied to the sputtering atmosphere.

The conductivity improving film 25c constitutes a second conductive film 25 together with the underlying conductive metal oxide film 25b and plays a role to compensate a conductivity of the second conductive film 25 that is liable to be insufficient only with the conductive metal oxide film 25b. Additionally, since iridium contained in the conductivity improving film 25c has an excellent barrier property against hydrogen, the conductivity improving film 25c also plays a role of blocking outside hydrogen to prevent the deterioration of the ferroelectric film 24.

It should be noted that in place of the iridium film, any one of a ruthenium film, a rhodium film and a palladium film may be formed as the conductivity improving film 25c.

Next, as shown in FIG. 3K, a platinum film is formed on the second conductive film 25 as a conductive cover film 18 in thickness of approximately 30 to 100 nm by the sputtering method. In the sputtering method, argon gas is used as sputtering gas. In addition, sputtering power of 1.0 kW is applied to the sputtering atmosphere under a pressure of 1 Pa for film formation.

Note that the conductive cover film 18 is not limited to the platinum film. The conductive cover film 18 may be a film made of metal element, which is different from a metal element constituting the conductivity improving film 25c and is platinum group elements except for iridium. For instance, in the case where the conductivity improving film 25c is made of an iridium film, the conductive cover film 18 may be formed of any one of a platinum film, a ruthenium film, a rhodium film and a palladium film.

Thereafter, a back surface of the silicon substrate 1 is washed.

Then, as shown in FIG. 3L, a titanium nitride film is formed on the conductive cover film 18 by the sputtering method as a first mask material layer 26.

Further, a silicon oxide film is formed on the first mask material layer 26 as a second mask material layer 27 by the plasma CVD method using TEOS gas.

Next, as shown in FIG. 3M, a second hard mask 27a is formed by patterning the second mask material layer 27 in an island shape.

Next, steps required until a cross-sectional structure shown in FIG. 3N is formed will be described below.

First, first hard masks 26a are formed by etching the first mask material layer 26 while using the second hard masks 27a as masks.

Then, the conductive cover films 18, the second conductive films 25, the ferroelectric films 24 and the first conductive films 23, which are not covered with the first and second hard masks 26a, 27a, are dry-etched. Thus, a capacitor Q, constructed from a lower electrode 25a, a capacitor dielectric film 24a and an upper electrode 23a, is formed.

Although gas for dry etching is not particularly limited, etching gas for the conductive cover film 18, the first conductive film 23 and the second conductive film 25 may be gas mixture of HBr and oxygen. On the other hand, etching gas for the ferroelectric film 24 may be gas mixture of chlorine and argon.

Further, since the conductive oxygen barrier film 22 has etching resistance against etching gas for the first conductive film 23, the conductive oxygen barrier film 22 remains over an entire surface of the crystalline conductive film 21 even after the capacitors Q is formed.

The capacitors Q, formed in such a way, are electrically connected to the first conductive plugs 32a through the conductive oxygen barrier film 22, the crystalline conductive film 21 and the third conductive plugs 36a, and their upper surfaces are protected with the conductive cover films 18.

Furthermore, by simultaneously etching the ferroelectric film 24 and the second conductive film 25 as in the above, side surfaces of the capacitor dielectric film 24a and the upper electrode 25a reside in the same plane.

Subsequently, as shown in FIG. 3O, the second hard masks 27a, made of silicon oxide, are removed by wet etching using etching liquid composed of mixed solution of hydrogen peroxide ($H_2O_2$), ammonia and water. The second hard masks 27a may be removed by dry etching.

Next, steps required until a cross-sectional structure shown in FIG. 3P is formed will be described below.

First, the crystalline conductive film 21 and the conductive oxygen barrier film 22 are etched using the first hard masks 26a (see FIG. 3O) as masks, thereby leaving these films only under the capacitors Q. This etching is carried out by dry etching and gas mixture of argon and chlorine is used as an etching gas.

Furthermore, since the first hard masks 26a are also etched by this etching gas, the first hard masks 26a are removed when the etching is completed.

Here, since the conductive cover film 18 is formed, upper surface of the upper electrode 25 is not exposed to the etching atmosphere and is not etched. Accordingly, constituting elements of the upper electrode 25a such as, for instance, iridium of the conductivity improving films 25c can be prevented from scattering from the upper surface of the upper electrode 25a in grains into the etching atmosphere. This reduces iridium grains deposited onto the side surface of the capacitor dielectric film 24a, making it possible to suppress the formation of a leak path between the lower electrodes 23a and the upper electrodes 25a due to the iridium grains.

Also, while the upper surface of the conductive cover films 18 made of platinum is exposed to the etching atmosphere to be slightly etched, the amount of etching is extremely less than that of the iridium film. Therefore, even if platinum grains is scattered from the upper surface of the conductive cover film 18 into the etching atmosphere and are deposited onto the side surface of the capacitor dielectric film 24a, leak paths are not formed by the platinum grains in a manner that the device operation is inhibited.

However, if the platinum grains are problematic, it is preferable that the capacitor Q is immersed in an etching solution, composed of hydrogen peroxide, ammonium and water, to remove the platinum grains by wet etching after the above process is completed. Such wet treatment eliminates a possibility that the platinum grains form leak paths.

Subsequently, as shown in FIG. 3Q, an alumina film ($Al_2O_3$) covering the capacitors Q is formed in thickness of approximately 20 nm, and the alumina film is used as a first capacitor protection insulating film 39. Alumina, constituting the first capacitor protection insulating film 39, is superior in hydrogen permeation protecting capability. Therefore, the first capacitor protective insulating film 39 blocks external hydrogen and deterioration in the capacitor dielectric films 24a due to hydrogen can be prevented.

Here, the capacitor dielectric films 24a suffer from damages due to dry etching (see FIG. 3O) performed when forming the capacitors Q and to the formation of the first capacitor protection insulating film 39 using the sputtering method.

Therefore, in order to recover the capacitor dielectric films 24a from damages, a recovery annealing is carried out for the capacitor dielectric films 24a in an oxygen-containing atmosphere. Although the conditions for the recovery annealing is not particularly limited, annealing is performed for about 60 minutes in a furnace at a substrate temperature of 550° C. to 700° C., for example 650° C.

Subsequently, as shown in FIG. 3S, an alumina film is formed on the first capacitor protection insulating film 39 in thickness of approximately 20 nm by the CVD method, and the alumina film is used as a second capacitor protection insulating film 40.

Next, steps required until a cross-sectional structure shown in FIG. 3T is formed will be described below.

First, a silicon oxide film is formed on the second capacitor protection insulating film 40 as a second interlayer insulating film 41 by a plasma CVD method using TEOS gas as a reactive gas. Such reactive gas also contains oxygen gas and helium gas. Moreover, although the thickness of the second interlayer insulating film 41 is not particularly limited, the thickness is 1500 nm over the flat surface of the silicon substrate 1.

In place of the silicon oxide film, an insulating inorganic film may be formed as the second interlayer insulating film 41.

Thereafter, surface of the second interlayer insulating film 41 is polished and planarized by a CMP method.

Furthermore, the surface of the second interlayer insulating film 41 is exposed to $N_2O$ plasma for dehydration treatment. Moisture remaining in the second interlayer insulating film 41 is dehydrated and reabsorption of moisture in the second interlayer insulating film 41 is avoided by the $N_2O$ plasma.

Note that $N_2$ plasma treatment may be performed as the dehydration process.

Subsequently, a flat alumina film is formed on the second interlayer insulating film 41 in thickness of approximately 20 nm to 100 nm by the sputtering method, and the alumina film is used as a third capacitor protection insulating film 42. Since the third capacitor protection insulating film 42 is formed on the flat second interlayer insulating film 41, superior coverage characteristic is not required for the third capacitor protection insulating film 42, and hence the third capacitor protection insulating film 42 can be formed by the inexpensive sputtering method. However, the deposition method of the third capacitor protection film 42 is not limited to the sputtering method and may be a CVD method.

Thereafter, as shown in FIG. 3U, an silicon oxide film is formed on the third capacitor protection insulating film 42 as a cap insulating film 43 in thickness of 80 nm to 100 nm using the plasma CVD method employing TEOS gas. A silicon oxynitride film or a silicon nitride film may be formed as the cap insulating film 43 alternatively.

Furthermore, the CMP method may be conducted to planarize a surface of the cap insulating film 43.

Next, steps required until a cross-sectional structure shown in FIG. 3V is formed will be described below.

First, by patterning the conductive cover film 18, the first to third capacitor protection insulating films 39, 40, 42, the second interlayer insulating film 41 and the capacitor insulating film 43, second holes 41a are formed in these films in depth reaching the conductivity improving film 25c (see FIG. 3J).

Next, in order to recover the capacitor dielectric films 24a from damage suffered in the preceding step, the silicon substrate 1 is placed in a furnace (not shown) and recovery annealing is conducted at the substrate temperature of 550° C. in an oxygen atmosphere.

Then, the patterning is performed for the first to third capacitor protection insulating films 39, 40, 42, the second interlayer insulating film 41, the cap insulating film 43, the underlying insulating film 15 and the oxidation preventing insulating film 14 to form a third hole 41b in these films.

Note that during the patterning, the second holes 41a are covered with resist pattern and protected from the etching atmosphere by the resist pattern.

Here, if an attempt is made to form these holes 41a, 41b simultaneously, the upper electrodes 25a in the second holes 42a are exposed to etching atmosphere for a long period of time until the deep third hole 41b is opened, so that such a problem arises that the capacitor dielectric film 24a deteriorates.

In contrast, the second and third holes 41a, 41b of different depth are formed separately as above in the present embodiment, the above problem can be avoided.

Moreover, the second conductive plug 32b, formed over the second source/drain region 8b, is covered with the oxidation preventing insulating film 14 until the present step is completed. Therefore, tungsten, constituting the second conductive plug 32b, is prevented from being oxidized and causing contact failure.

Subsequently, a titanium film and a titanium nitride film are formed on the cap insulating film 43 and in the second and third holes 41a, 41b as a glue film in this order by the sputtering methods.

Note that the titanium nitride film may be formed by an MOCVD method. In this case, for the purpose of removing carbon from the titanium nitride film, the titanium nitride film may be annealed under hydrogen containing atmosphere. Even if the annealing is performed in the hydrogen containing atmosphere in this manner, the conductivity improving films 25c (see FIG. 3K), @made of iridium, formed on the uppermost layer of the upper electrodes 25a block the entry of hydrogen. Therefore, possibility that the conductive metal oxide films 25b is reduced by hydrogen is eliminated.

Further, the glue film is not limited to stack films of the titanium film and titanium nitride film and may be formed of a single layer film of any one of a titanium film, a tantalum nitride and a titanium aluminum nitride film or a stack film of these films.

Furthermore, a tungsten film is formed on the glue film by the CVD method and the second and third holes 41a, 41b are completely buried with the tungsten film.

In addition, excess glue film and tungsten film on the cap insulating film 43 is polished away by CMP method, thereby leaving these films only in the second and third holes 41a, 41b as fourth and fifth conductive plugs 47a, 47b.

Of these plugs, the fourth conductive plugs 47a are electrically connected to the upper electrodes 25a of the capacitors Q. On the other hand, the fifth conductive plug 47b is electrically connected to the second conductive plug 32b and forms a part of a bit line together with the second conductive plug 32b.

Here, if the titanium nitride film, forming a part of the glue film of the fourth conductive plugs 47a, is brought into contact with the conductive metal oxide film 25b constituting the upper electrodes 25a, such a disadvantage takes place that the contact resistance between the upper electrode 25a and the fourth conductive plug 47a becomes higher. In view of this, the conductivity improving films 25c are formed on the uppermost layers of the upper electrodes 25a, so that the contact resistance between the upper electrode 25a and the fourth conductive plug 47a can be lowered.

Thereafter, as shown in FIG. 3W, stacked metal films are formed on the cap insulating film 43 and the conductive plugs 47a, 47b respectively by the sputtering method. Then, the stacked metal films are patterned into metal wiring 49a and bit line conductive pad 49b.

For the stacked metal films, a titanium film of a thickness of 60 nm, a titanium nitride film of a thickness of 30 nm, a copper containing aluminum film of a thickness of 360 nm, a titanium film of a thickness of 5 nm and a titanium nitride film of a thickness of 70 nm are formed in this order.

With the foregoing steps, a basic structure of the semiconductor device of the present embodiment is completed.

According to the present embodiment set forth above, the conductive cover layers 18 are formed on the upper electrodes 25a. Therefore, the upper surfaces of the upper electrodes 25a can be protected from etching atmosphere during dry etching of the crystalline conductive films 21 shown in FIG. 3P, so that the iridium residing in the upper surfaces of the upper electrodes 25a can be prevented from being etched. As a result, iridium grains, which are released from the upper surface of the upper electrode 25d into the etching atmosphere, are prevented from depositing onto the side surface of the capacitor dielectric film 24a. Thus, it is made possible to prevent the formation of the leak paths due to the iridium grains.

(3) Second Embodiment

FIGS. 5A to 5L are cross-sectional views showing a semiconductor device of a second embodiment according to the present invention in a course of manufacturing. Note that the same reference numerals are designated to the same element as in the first embodiment, and their explanation will be omitted in the following.

In the step of the first embodiment shown in FIG. 3C, the third conductive plug 36a is formed by polishing the glue film 35 and the conductive plug film 36.

However, since the polishing speed of the glue film 35 and the conductive plug film 36 is higher than that of the underlying insulating film 15 for the slurry used in the CMP, it is difficult to align the height of upper surfaces of each of the third conductive plug 36a and the underlying insulating film 15 at the time the CMP is completed.

Figure 5A:
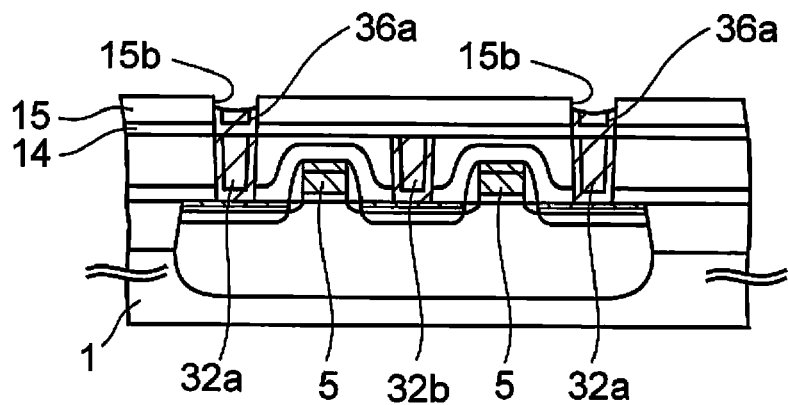
FIGS. 5A to 5L are cross-sectional views showing a semiconductor device of a second embodiment according to the present invention in the course of fabrication thereof.

Therefore, in an actual situation, as shown in FIG. 5A, recesses 15b are formed in the underlying insulating film 15, so that the height of the third conductive plug 36a becomes lower than that of the underlying insulating film 15. Depth of the recess 15b is 20 nm to 50 nm, and typically 50 nm.

However, if the recess 15b is present, orientations of the lower electrode and the capacitor dielectric film are disoriented, thereby posing such a problem that the ferroelectric characteristic of the capacitor dielectric film deteriorates.

In order to solve such problem, the following steps are carried out in the present embodiment.

Figure 5B:
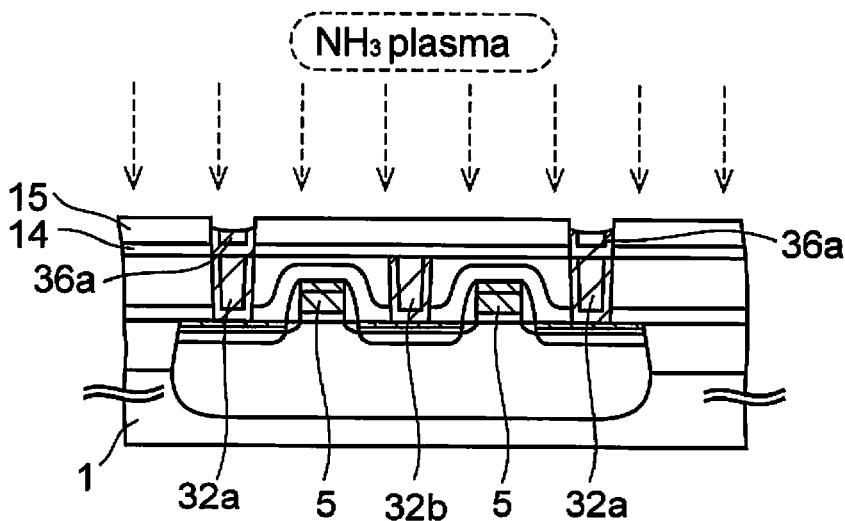

First, as shown in FIG. 5B, ammonia plasma process is carried out on the underlying insulating film 15, thereby bonding the NH groups to oxygen atoms appearing on the surface of the underlying insulating film 15.

The ammonia plasma process is performed using a plasma processing equipment in which an opposing electrode is disposed at a distance from the silicon substrate 1 by about 9 nm (350 mils). The ammonia plasma process is carried out by keeping a substrate temperature at 400° C. in the pressure of 266 Pa (2Torr) while supplying ammonia gas to a chamber at a flow rate of 350 sccm. Furthermore, high frequency electricity of 13.56 MHz and power of 100 W is supplied to the silicon substrate 1, and high frequency electricity of 350 kHz and power of 55 W is supplied to the above described opposing electrode for 60 seconds.

Figure 5C:
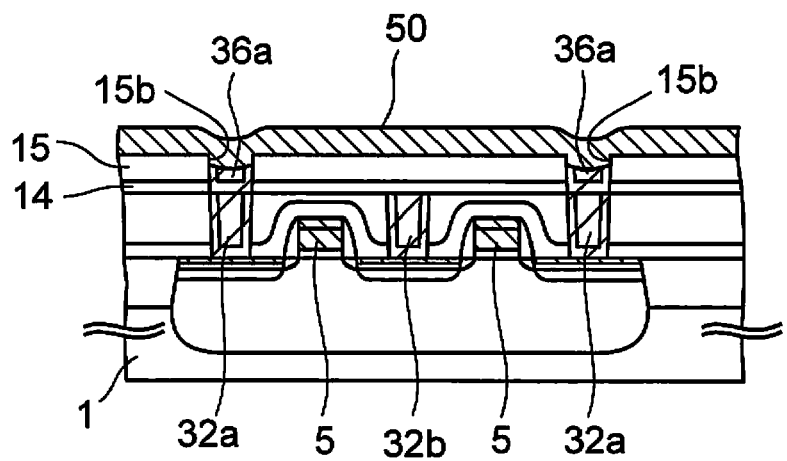

Next, as shown in FIG. 5C, a titanium film is formed on the underlying insulating film 15 and the third conductive plugs 36a as a planarizing conductive film 50 in thickness of 100 nm to 300 nm, approximately 100 nm for example, thereby completely burring the recess 15b with the planarizing conductive film 50.

A deposition condition of the planarizing conductive film 50 is not particularly limited. In the present embodiment, the planarizing conductive film 50 is formed using a sputtering equipment, in which the silicon substrate 1 and a titanium target are spaced by a distance of 60 mm. The planarizing conductive film 50 is formed in argon atmosphere of a pressure of 0.15 Pa, while applying a DC sputtering power of 2.6 kW to the atmosphere for 35 seconds and keeping the substrate temperature to 20° C.

Further, since NH groups are bonds to oxygen atoms on the surface of the underlying insulating film 15 by the ammonia plasma process (see FIG. 5B) prior to forming the planarizing conductive film 50, titanium atoms deposited on the underlying insulating film 15 is made difficult to be captured by the oxygen atoms. As a result, the titanium atoms can freely move on the surface of the underlying insulating film 15, thereby making it possible to form the planarizing conductive film 50 made of titanium intensively self-oriented in a (002) direction.

Note that the planarizing conductive film 50 is not limited to the titanium film. The planarizing conductive film 50 may be made of any one of a tungsten film, a silicon film and a copper film.

Thereafter, RTA is performed for the planarizing conductive film 50 at a substrate temperature of 650° C. in nitrogen atmosphere to nitride the planarizing conductive film 50, thereby constructing the planarizing conductive film 50 from titanium nitride polarized in a (111)direction.

Here, reflecting the recesses 15b formed in the underlying insulating film 36a around the third conductive plug 36a, concave portions is formed in the upper surface of the planarizing conductive film 50. However, if the concave portions are left formed, there is possibility that the crystalline structure of the ferroelectric film, formed subsequently over the planarizing conductive film 50, is deteriorated.

Figure 5D:
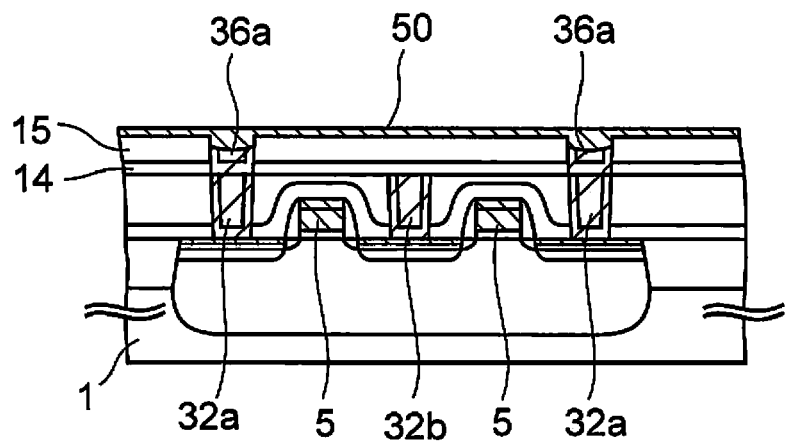

Therefore, in the present embodiment, as shown in FIG. 5D, planarizing conductive film 50 is polished and planarized by CMP method, thereby removing the above-described concave portions. Slurry used in this CMP method is not particularly limited. In the present embodiment, SSW2000 manufactured by Cabot Microelectronics Corporation is used as the slurry.

Note that due to polishing error, the thickness of the planarizing conductive film 50 after the CMP varies in the surface of the silicon substrate or in a plurality of silicon substrates. In consideration of such variation, a target thickness of the planarizing conductive film 50 is set to 50 nm to 100 nm, more preferably 50 nm, by controlling the polishing time.

By the way, after the CMP is performed for the planarizing conductive film 50, crystal structure of the planarizing conductive film 50 in the vicinity of its upper surface is in a distorted state. However, if an attempt is made to form capacitor lower electrodes over the planarizing conductive film 50 whose crystal structure is distorted, the lower electrodes pick up the distortion. As a result, crystal structure of the lower electrodes deteriorate, which in turn deteriorates the ferroelectric characteristic of the ferroelectric films formed on the lower electrodes.

Figure 5E:
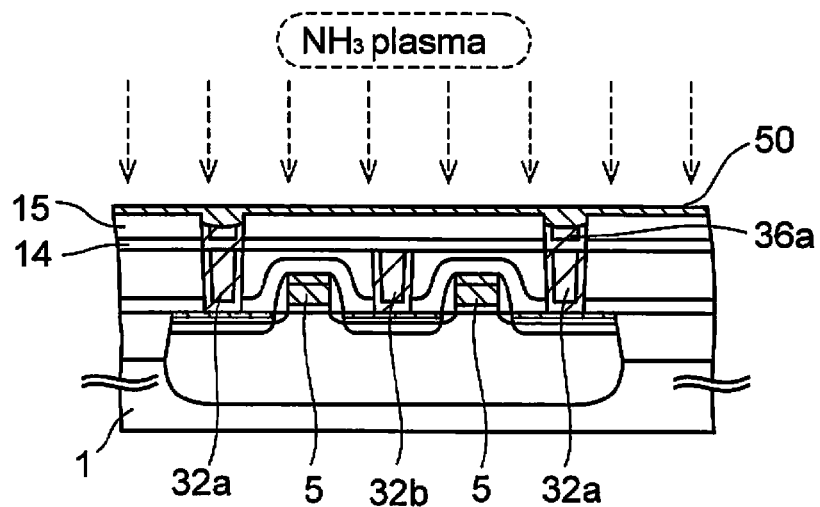

For the purpose of avoiding such a disadvantage, in the following step, by exposing the upper surface of the planarizing conductive film 50 to ammonia gas plasma as shown in FIG. 5E, the distortion of the crystal structure of the planarizing conductive film 50 is prevented from being transferred to an overlaying film.

Figure 5F:
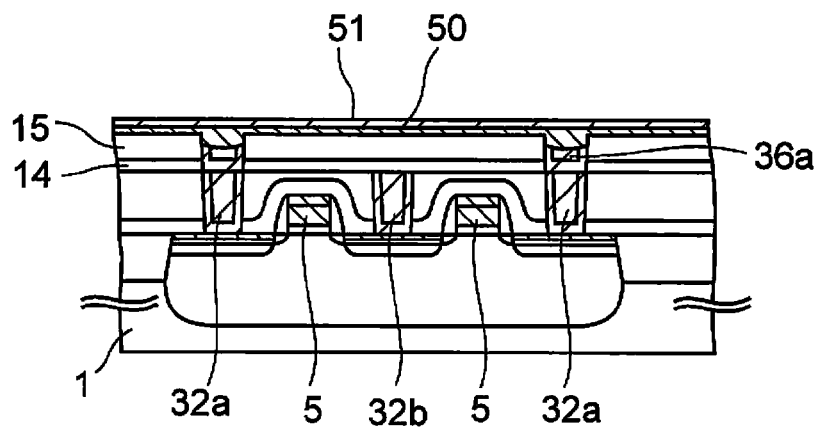

Next, as shown in FIG. 5F, an iridium film is formed by the sputtering method as a conductive adhesion film 51 on the planarizing conductive film 50, whose distortion in the crystal structure is eliminated by the ammonia gas plasma process. The conductive adhesion film 51 plays a role as a film for increasing adhesion strength between the upper and lower films. The conductive adhesion film 51 is preferably formed thinner as possible, for example equal to or less than 20 nm, or more preferably 5 nm to 10 nm.

Figure 5G:
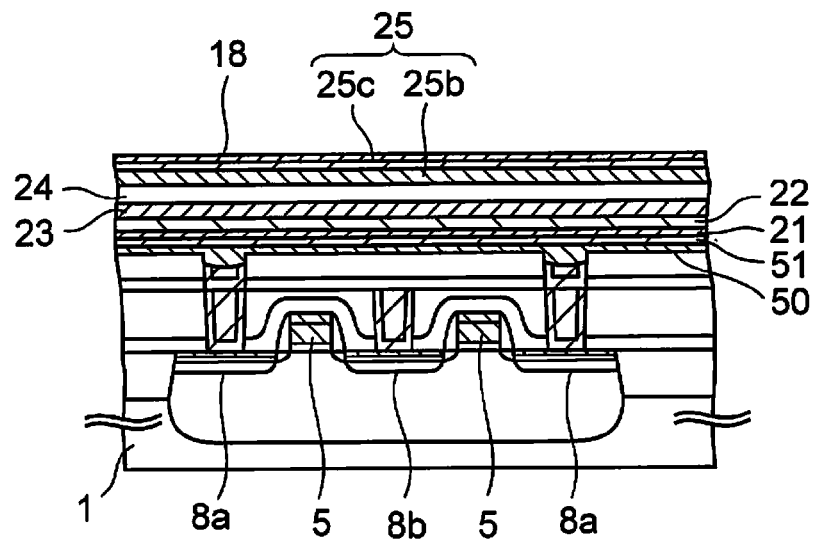

Subsequently, by performing the steps shown in FIGS. 3E to 3K explained in the first embodiment, films from a crystalline conductive film 21 to a conductive cover film 18 are stacked as shown in FIG. 5G.

Figure 5H:
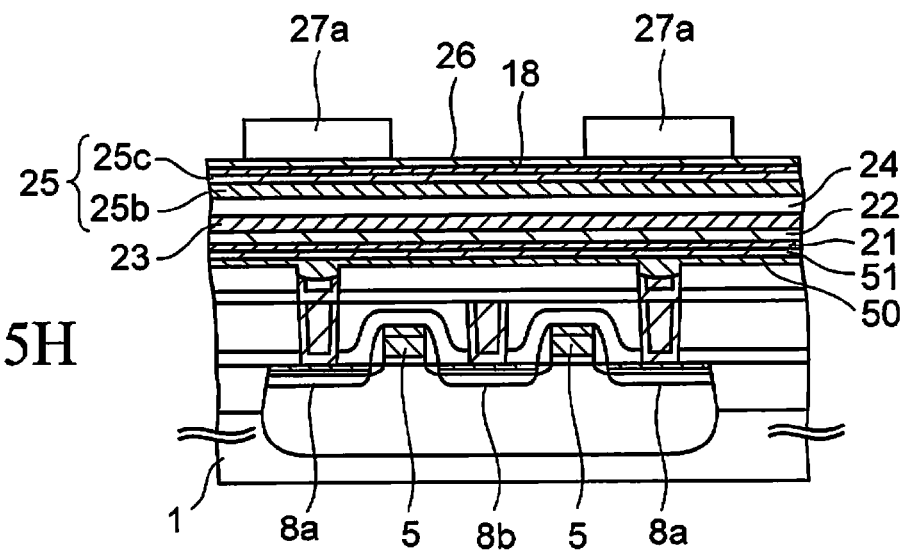

Subsequently, by performing the steps explained in FIGS. 3L to 3M, a first mask material layer 26 and second hard mask 27a are formed on the conductive cover film 18 as shown in FIG. 5H.

Figure 5I:
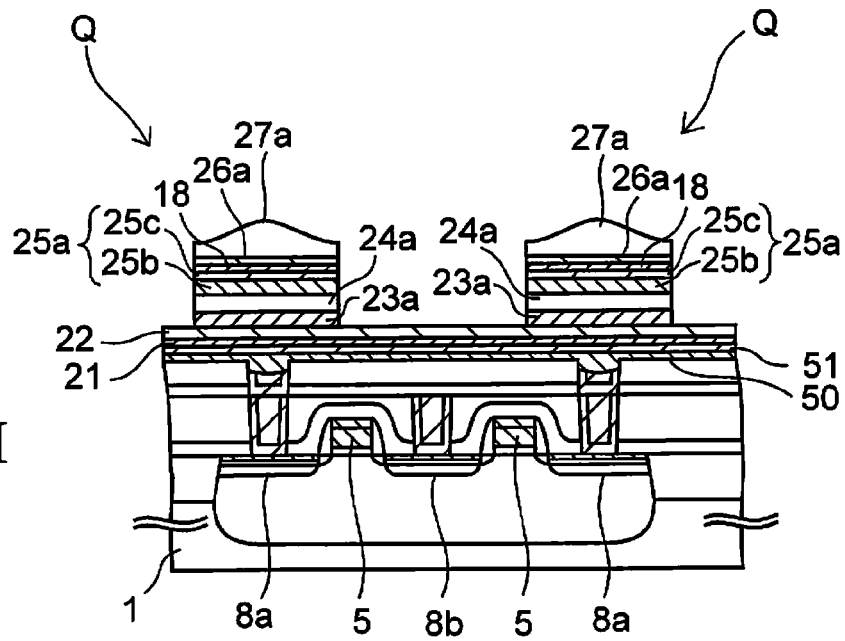

Then, as shown in FIG. 5I, the first mask material layer 26 is subjected to etching using the second hard masks 27a as masks, thereby forming first hard masks 26a.

Thereafter, portions of the conductive cover film 18, the second conductive film 25, the ferroelectric film 24 and the first conductive film 23, which is not covered with the first and second hard mask 26a and 27a, are subjected to dry etching, thereby forming capacitors Q that is constructed from the lower electrode 25a, the capacitor dielectric film 24 and the upper electrode 23a.

In such etching process, gas mixture of HBr and oxygen is used as etching gas for the conductive cover film 18, the first conductive film 23 and the second conductive film 25 like the first embodiment, and gas mixture of chlorine and argon is used as etching gas for the ferroelectric film 24.

Figure 5J:
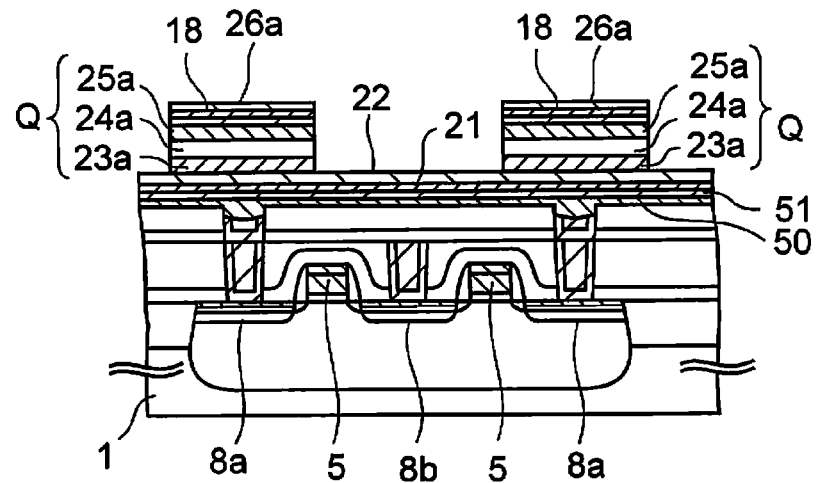

Subsequently as shown in FIG. 5J, the second hard masks 27a made of oxide silicon are removed by wet etching using an etching solution composed of mixed solution of hydrogen peroxide, ammonia and water. Note that the second hard masks 27a may be removed by dry etching.

Figure 5K:
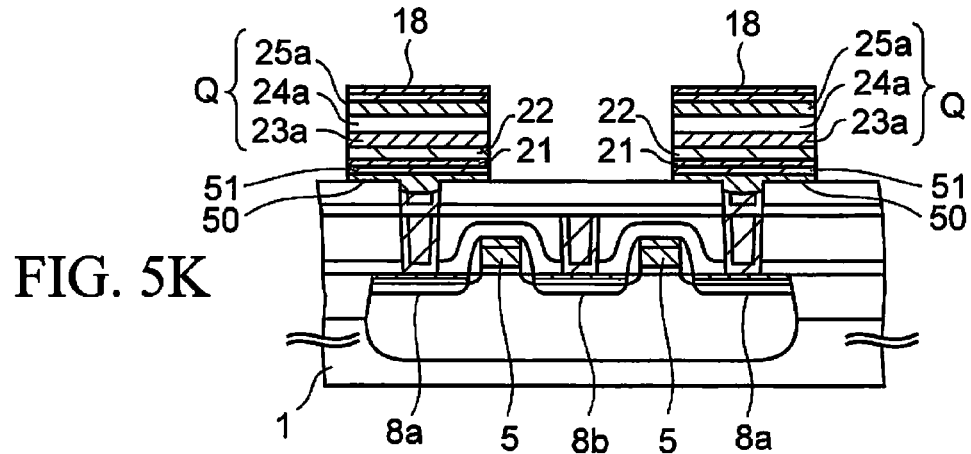

Next, steps required until a cross-sectional structure shown in FIG. 5K is formed will be described below.

First, while using the hard masks 26a (FIG. 5J) as the masks, etching is performed for the portions of conductive oxygen barrier film 22, the crystalline conductive film 21, the conducting adhesion film 51 and the planarizing conductive film 50, which are exposed from the lower electrodes 23a, thereby leaving these films only under the capacitors Q. This etching is conducted by dry etching using gas mixture of, for instance, argon and chlorine, as etching gas.

Additionally, since the first hard masks 26a are also etched by the etching gas, the first hard masks 26a are removed at the end of etching.

Here, since the conductive cover film 18 is formed like in the first embodiment, upper surface of the upper electrode 25a is not exposed to the etching atmosphere. Accordingly, the upper surface of the upper electrode 25a is prevented from being etched, so that iridium grains is not scattered from the upper surface to the etching atmosphere. As a result, the number of iridium grains that redeposit on the side surface of the capacitor dielectric film 24a can be lowered, thereby suppressing the formation of leak paths due to the iridium grains.

Note that the platinum grains, slightly deposited onto the side surface of the capacitor Q from the conductive cover film 18 at the time of the dry etching, may be removed by immersing the capacitor Q into etching solution. For such etching solution, a mixed solution of, for instance, hydrogen peroxide, ammonia and water may be employed. Such wet etching makes it possible to assuredly prevent leak paths from being formed on the side surface of the capacitors Q.

Figure 5L:
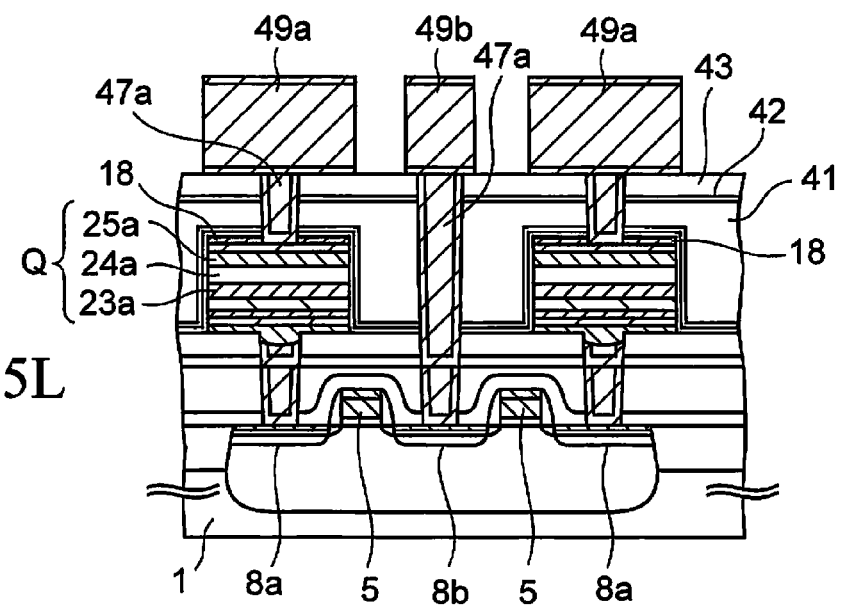

After that, by performing the steps shown in FIGS. 3Q to 3W explained in the first embodiment, a basic structure of the semiconductor device of the present embodiment is completed as shown in FIG. 5L.

According to the present embodiment set forth above, as described with reference to FIGS. 5C and 5D, the recesses 15b, formed in the areas around the third conductive plugs 36a by the CMP method, are buried with the planarizing conductive film 50, which is in turn further planarized using the CMP method.

Accordingly, the lower electrodes 23a (see FIG. 5K) formed over the planarizing conductive films 50 have favorable flatness, which allows the lower electrodes 23a to have preferable polarization.

Additionally, the capacitor dielectric films 24a have increased polarizations due to actions of the polarizations of the lower electrodes 23a, which in turn increases ferroelectric characteristics of the capacitor dielectric films 24a such as switching charges.

Furthermore, since the upper surface of the upper electrode 25a is covered with the conductive cover film 18, upper surface of the upper electrode 25a is protected from the etching atmosphere in the dry etching of the crystalline conductive films 21 shown in FIG. 5K. Thus, it is made possible to prevent iridium, residing in the upper surface of the upper electrode 25a, from being etched. This can suppress the iridium grains, released from the upper surfaces of the upper electrodes 25a, from being redeposited onto the side surface of the capacitor dielectric films 24a, making it possible to prevent the formation of a leak path due to the iridium grains.

(4) Third Embodiment

Figure 6:
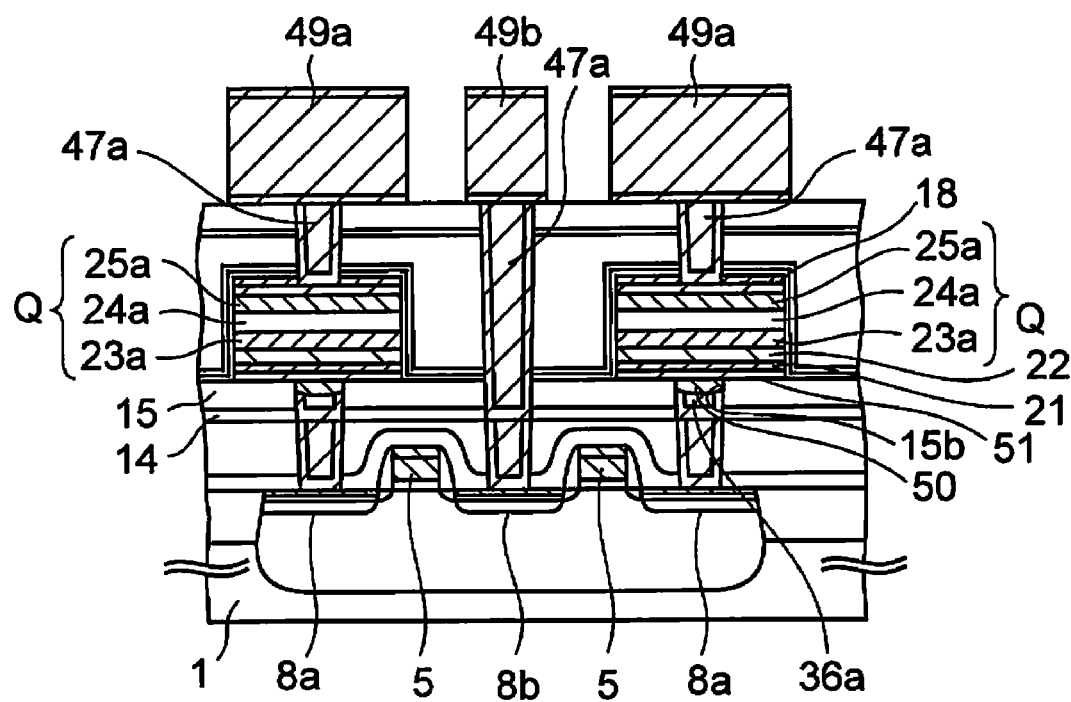
FIG. 6 is a cross-sectional view of a semiconductor device of a third embodiment according to the present invention.

FIG. 6 is a cross-sectional view of the semiconductor device of the present embodiment.

The present embodiment differs from the second embodiment in that the planarizing conductive film 50 is removed from the upper surface of the underlying insulating film 15 in the CMP process shown in FIG. 5D and left only in the recesses 15b. Another feature of the present embodiment is the same as the second embodiment.

In the present embodiment, the upper surfaces of the upper electrodes 25a are also covered with the conductive cover films 18. This prevents iridium grains from being scattered from the upper surfaces of the upper electrodes 25a at the time of etching the crystalline conductive film 21, thereby avoiding an increase in leak current of the capacitors Q due to the iridium grains redeposited onto the side surface of the capacitor dielectric films 24.

(5) Fourth Embodiment

Figure 7A:
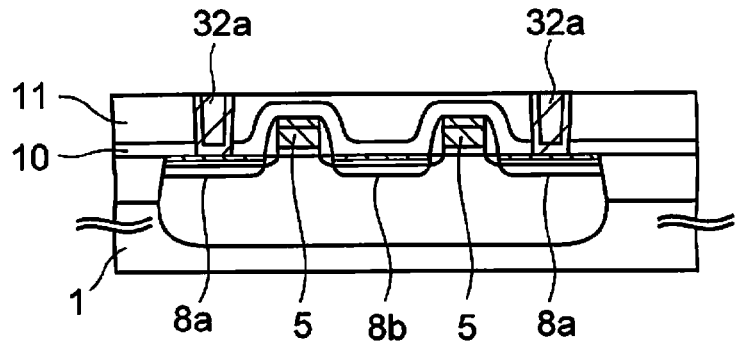
FIGS. 7A to 7O are cross-sectional views showing a semiconductor device of a fourth embodiment according to the present invention in the course of fabrication thereof.
Figure 7B:
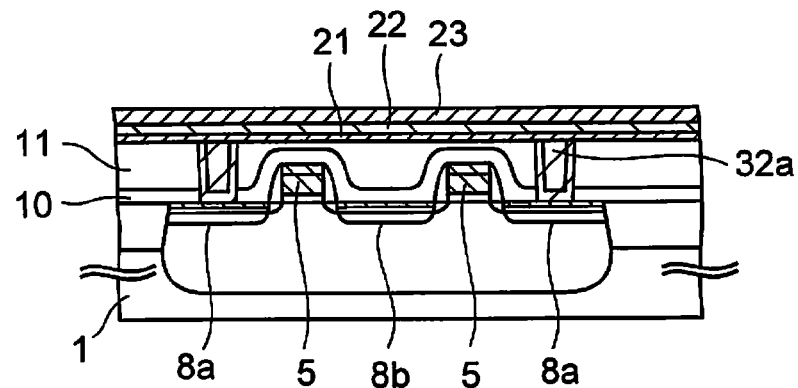
Figure 7C:
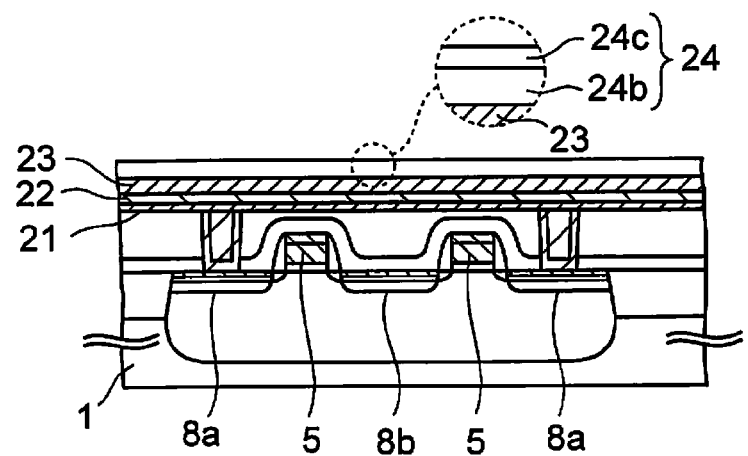
Figure 7D:
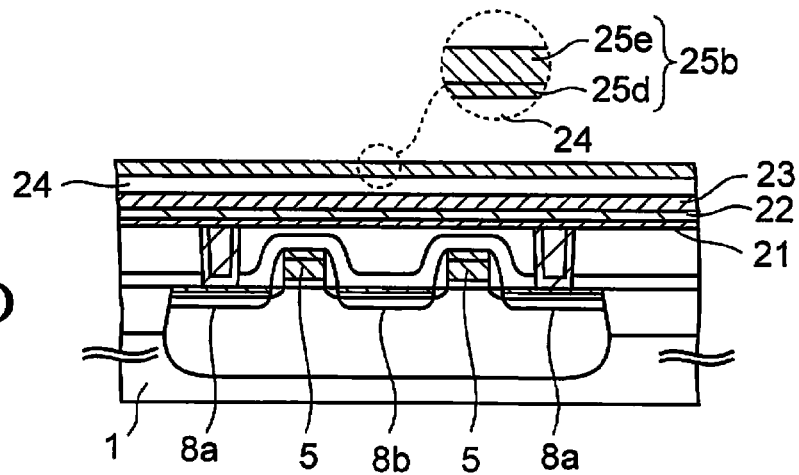
Figure 7E:
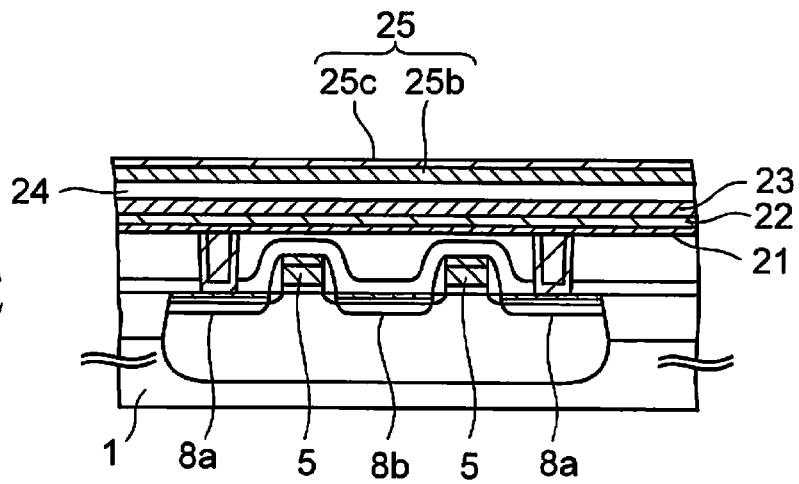
Figure 7F:
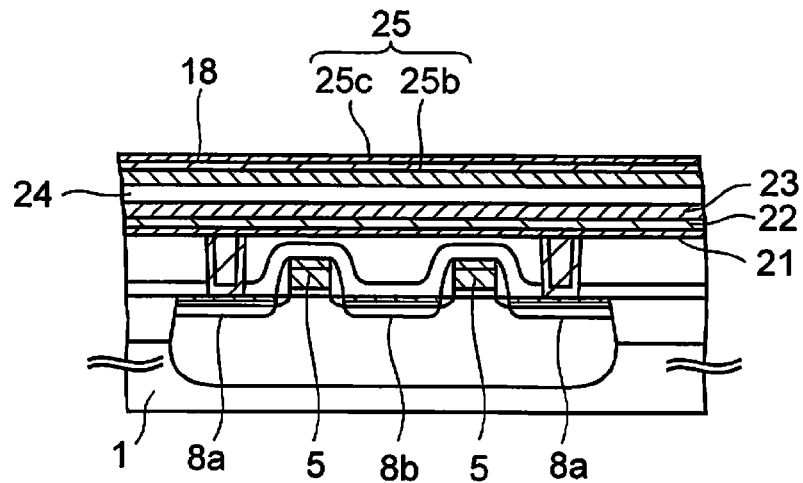
Figure 7G:
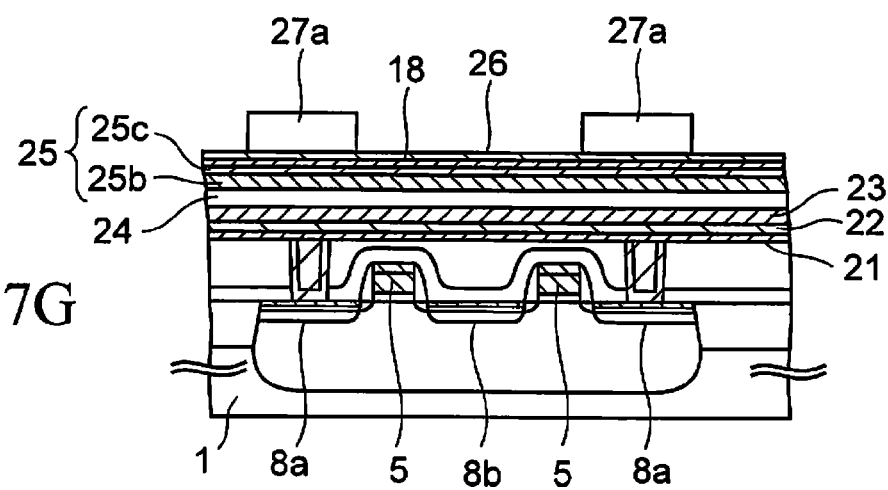
Figure 7H:
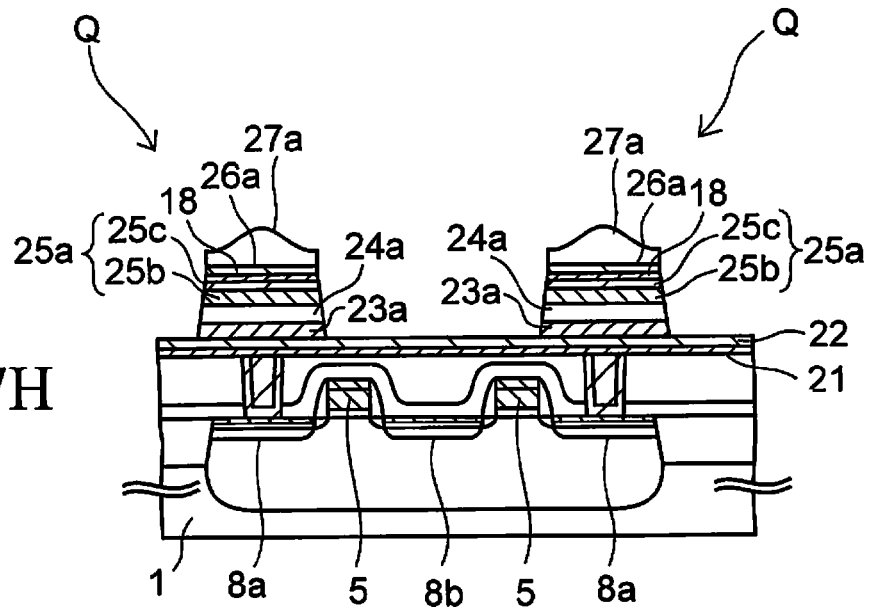
Figure 7I:
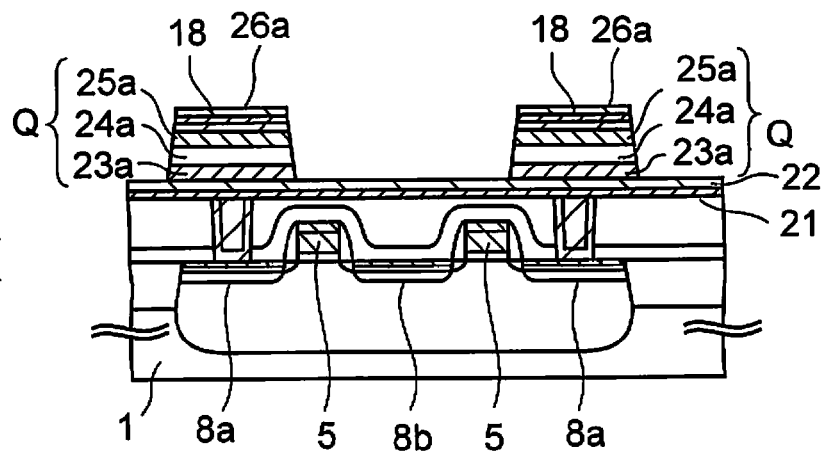
Figure 7J:
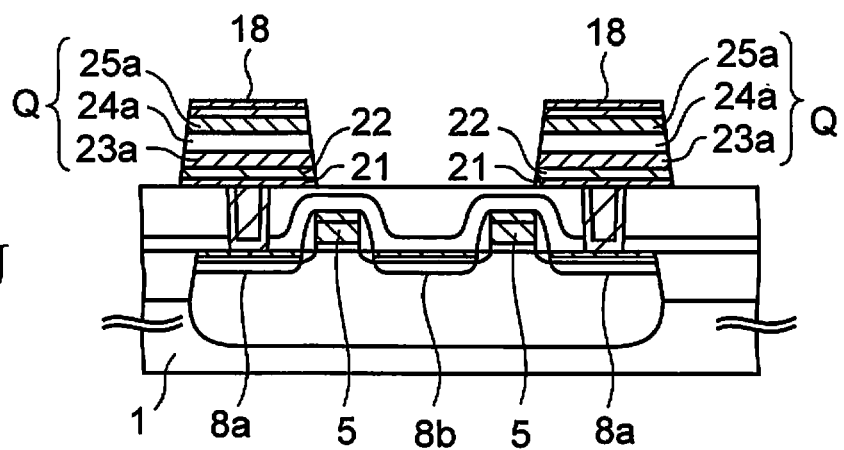
Figure 7K:
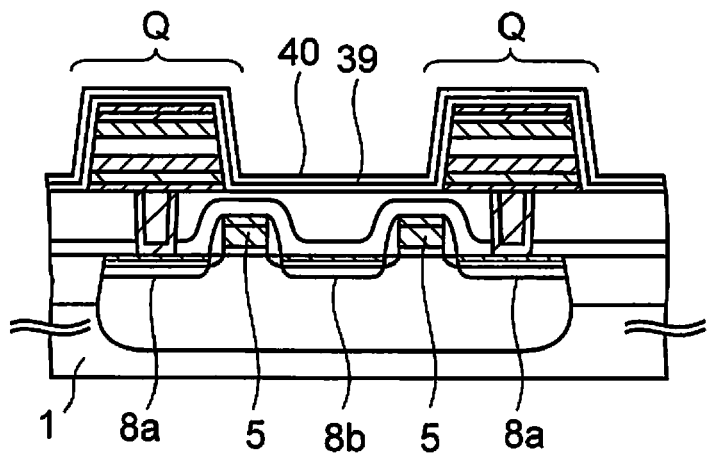
Figure 7L:
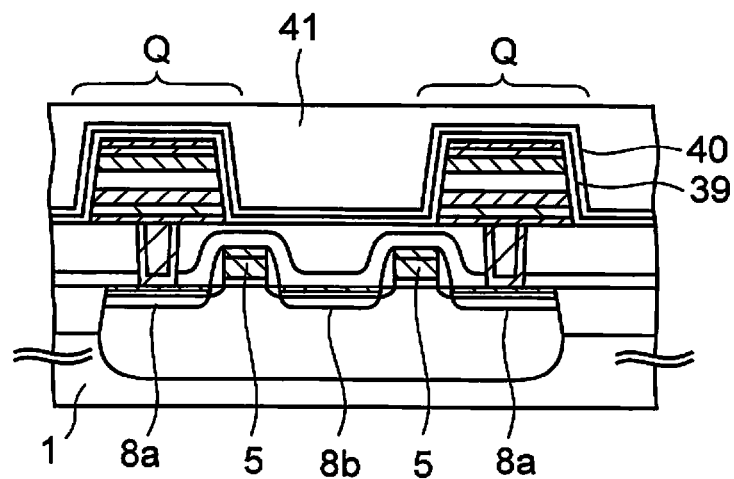
Figure 7M:
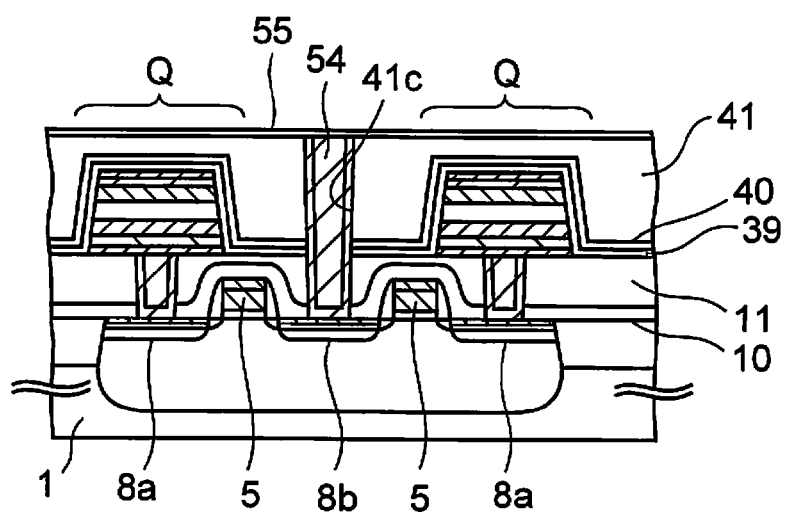
Figure 7N:
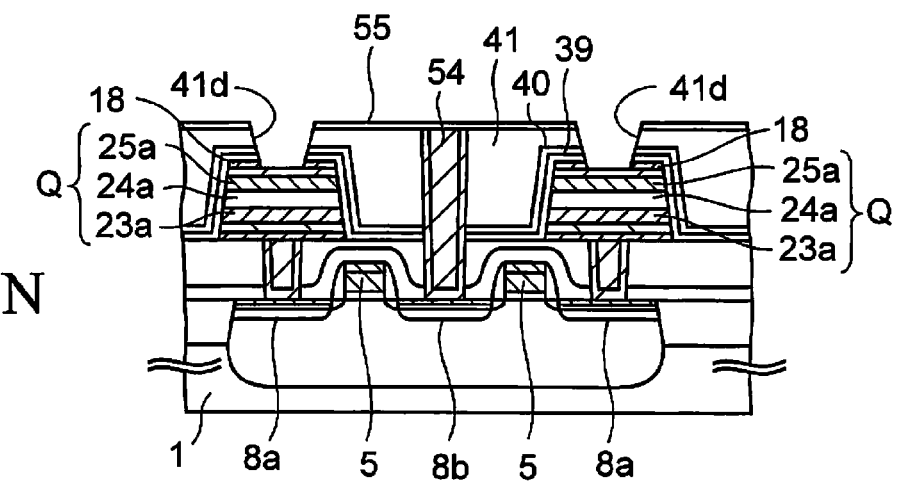
Figure 7O:
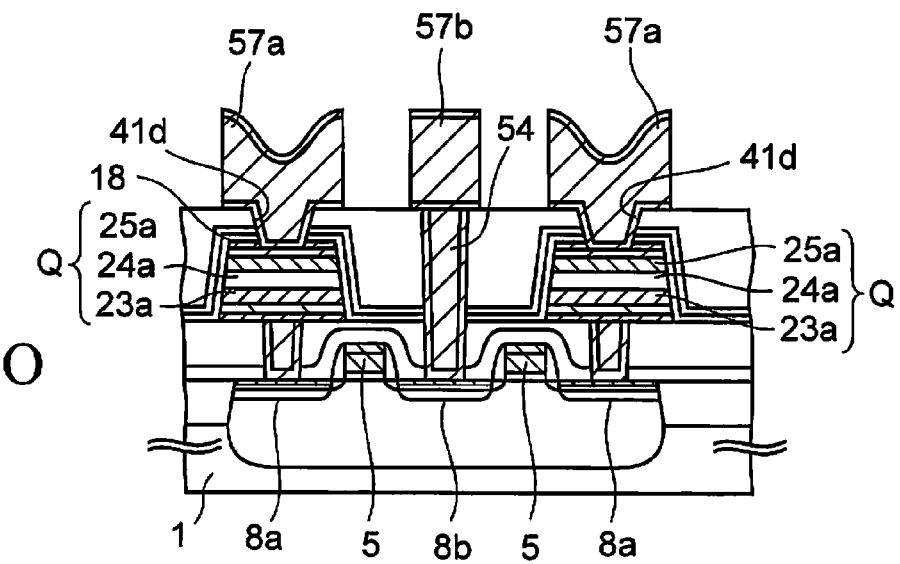

FIGS. 7A to 7O are cross-sectional views showing a semiconductor device of the present embodiment in the course of manufacturing. Note that the same reference numerals are designated to the same element as in the first embodiment, and their explanation will be omitted in the following.

Firstly, description is made of steps until a cross-sectional structure shown in FIG. 7A is obtained.

First, the cover insulating film 10 and the first interlayer insulating film 11 are formed on the silicon substrate 1 in accordance with the process of the first embodiment described with reference to FIG. 3A. Then, contact holes are formed on the first source/drain regions 8a by patterning these insulating films.

Further, a glue film and a tungsten film is formed in the contact holes in this order. Thereafter, excess glue film and tungsten film on the first interlayer insulating film 11 are removed by polishing using the CMP method, thereby leaving these films only in the contact holes as first conductive plugs 32a.

Next, as shown in FIG. 7B, a titanium film is formed on the first insulating film 11 and the first conductive plugs 32a respectively as a crystalline conductive film 21.

Note that prior to the formation of the crystalline conductive film 21, ammonia plasma process may be performed for the respective upper surfaces of the first insulating film 11 and the first conductive plugs 32a in advance. According to the ammonia plasma process, the titanium atoms deposited on the first insulating film 11 are made difficult to be captured by oxygen atoms on the insulating film 11. Therefore, the titanium atoms can freely move on the surface of the first insulating film 11, thereby making it possible to construct the crystalline conductive film 21 from titanium that is intensively self-oriented in a (002) direction.

Subsequently, RTA is performed for the crystalline conductive film 21 in nitrogen atmosphere at the substrate temperature of 650° C. for 60 seconds. This allows the underlying insulating film 21, formed of titanium, to be nitrided, resulting in the formation of the crystalline conductive film 21 with titanium nitride polarized in a (111)direction.

Additionally, a titanium aluminum nitride film is formed on the crystalline conductive film 21 as a conductive oxygen barrier film 22 in thickness of 100 nm by reactive sputtering method.

Then, an iridium film is formed on the conductive oxygen barrier film 22 as a first conductive film 23 in the thickness of approximately 100 nm by the sputtering method.

Thereafter, in order to improve the crystallization and adhesiveness of the first conductive film 23, RTA is performed for the first conductive film 23 for 60 seconds in argon atmosphere with the substrate temperature of equal to or more than 650° C.

Then, as shown in FIG. 7C, the PZT film is formed on the first conductive film 23 by the MOCVD method as a first ferroelectric film 24b.

The first ferroelectric film 24b is not limited to the PZT film. A film, whose crystalline structure takes the form of a Bi-layered structure or perovskite structure by annealing, may be formed as the first ferroelectric film 24b. Of these, the film taking the form of the perovskite structure includes a PZT film in which any one of lanthanum, calcium, strontium and silicon is doped with a small amount.

Further, the film taking the Bi-layered structure includes a $(Bi_{1-x}R_x)Ti_3O_{12}$ film (where R represents rare earth element and $0<x<1$), an $SrBi_2Ta_2O_9$ film and an $SrBi_4Ti_4O_{15}$ film.

Then, an amorphous PZT film is formed on the first ferroelectric film 24b as a second ferroelectric film 24c by the sputtering method, and the first and second ferroelectric films 24a, 24c are used as a ferroelectric film 24.

The second ferroelectric film 24c is not limited to the PZT film. Like the first ferroelectric film 24b, the PZT film in which one of lanthanum, calcium, strontium and silicon is doped with a small amount may be formed as the second ferroelectric film 24c. Additionally, the second ferroelectric film 24c may be made of material of the Bi-layered structure such as $(Bi_{1-x}R_x)Ti_3O_{12}$ (where R represents rare earth element and $0<x<1$), $SrBi_2Ta_2O_9$ and an $SrBi_4Ti_4O_{15}$.

Subsequently, as shown in FIG. 7D, by performing the step shown in FIG. 3I of the first embodiment, first and second conductive metal oxide films 25d, 25e, both made of iridium oxide, are formed on the ferroelectric film 24. Then, these films 25d, 25e are used as conductive metal oxide film 25b.

Further, as shown in FIG. 7E, conductivity improving film 25c, made of iridium, is formed on the conductive metal oxide film 25b by performing the step of FIG. 3J of the first embodiment. Thus, the second conductive film 25, formed of the conductive metal oxide film 25b and the conductivity improving film 25c, are formed on the ferroelectric film 24.

Subsequently, as shown in FIG. 7F, a platinum film is formed on the second conductive film 25 in thickness of approximately 30 nm to 100 nm by the sputtering method as a conductive cover film 18.

Next, as shown in FIG. 7G, a first mask material layer 26, made of titanium nitride, is formed on the conductive cover film 18 by the sputtering method.

Moreover, a silicon oxide film is formed on the first mask layer 26 by the plasma CVD method using TEOS gas, and the silicon oxide film is patterned into a second hard mask 27a.

Next, as shown in FIG. 7H, a first hard mask 26a is formed by etching the first mask material layer 26 while using the second hard mask 27a as a mask.

Then, portions of the conductive cover film 18, the second conductive film 25, the ferroelectric film 24 and the first conductive film 23, which are not covered with the first and second hard masks 26a, 27a, are subjected to dry etching, thereby forming the capacitors Q constructed from the lower electrode 25a, the capacitor dielectric film 24a and the upper electrode 23a.

Note that the condition for such dry etching is described with reference to FIG. 3N of the first embodiment and is therefore herein omitted.

Moreover, even if the dry etching is carried out, the conductive oxygen barrier film 22 is not etched and remains on an entire surface of the crystalline conductive film 21.

Then, as shown in FIG. 7I, the second hard masks 27a are removed by wet etching or dry etching. In the case of wet etching, a mixed solution composed of hydrogen peroxide, ammonia and water is employed as an etching solution.

Next, steps required until a cross-sectional structure shown in FIG. 7L is formed will be described below.

First, the crystalline conductive film 21 and the conductive oxygen barrier film 22 are subjected to dry etching using the first hard masks 26a (see FIG. 7I) as masks to leave these films only under the capacitors Q.

Since the first hard masks 26a are also etched by the etching gas, the first hard masks 26a are removed when the etching is completed, and the upper surfaces of the conductive cover films 18 are exposed.

Here, since the upper surface of the upper electrode 25a is covered with the conductive cover film 18, the upper surface is not exposed to the above etching atmosphere. Accordingly, iridium grains do not scattered from the upper surface of the upper electrode 25a to the etching atmosphere, thereby making it possible to prevent the formation of the leak paths due to the iridium grains redeposited onto the side surface of the capacitor dielectric 24a.

Next, as shown in FIG. 7K, for the purpose of protecting the capacitors Q from reducing substances such as hydrogen or the like, the alumina film is formed on an entire surface of the silicon substrate 1 in thickness of approximately 20 nm as the first capacitor protection insulating film 39.

Then, in order to recover the capacitor dielectric films 24a from damages caused by dry etching (see FIG. 7I) carried out when forming the capacitors Q and sputtering performed when forming the first capacitor protection insulating film 39, a recovery annealing is carried out for the capacitor dielectric films 24a in the oxygen-containing atmosphere. The recovery annealing is carried out in a furnace for about 60 minutes, while maintaining the substrate temperature 550° C. to 700° C., for example 650° C.

Thereafter, an alumina film is formed on the first capacitor protection insulating film 39 in thickness of approximately 20 nm by the CVD method as a second capacitor protection insulating film 40.

Then, as shown in FIG. 7L, a silicon oxide film is formed on the second capacitor protection insulating film 40 as a second interlayer insulating film 41 by a plasma CVD method using TEOS gas as a reactive gas. The reactive gas also contains oxygen gas and helium gas. Moreover, the second interlayer insulating film 41 has a thickness of 1500 nm over the flat surface of the silicon substrate 1.

Note that in place of the silicon oxide film, an insulating inorganic film may be formed as the second interlayer insulating film 41.

Subsequently, the CMP method is performed to polish and planarize the surface of the second interlayer insulating film 41.

Next, steps required until a cross-sectional structure shown in FIG. 7M is formed will be described below.

First, a surface of the second interlayer insulating film 41 is exposed to $N_2O$ plasma for removing moisture remaining in the second interlayer insulating film 41 and for preventing the reabsorption of moisture to the second interlayer insulating film 41.

Note that N$_2$ plasma process may be performed as the dehydration process.

Then, patterning is performed for the cover insulating film 10, the first and second interlayer insulating films 11, 41 and the first and second capacitor protection insulating films 39, 40. Thus, a first hole 41c is formed in these films over the second source/drain region 8b.

Further, a glue film and a tungsten film are formed in the first hole 41c in this order. Thereafter, excess glue film and tungsten film on the second interlayer insulating film 41 are polished and removed by CMP, thereby leaving these films only in the first hole 41c as a second conductive plug 54.

The second conductive plug 54 forms a part of a bit line and is electrically connected to the second source/drain region 8b.

By the way, since the second conductive plug 54 is mainly composed of tungsten that is easily oxidized, contact failure is liable to occur when the second conductive plug 54 is oxidized in the process.

Therefore, in order to prevent the oxidation of the second conductive plug 54, a silicon oxynitride film is formed on respective surfaces of the second interlayer insulating film 41 and the second conductive plug 54 in thickness of approximately 100 nm as an oxidation preventing insulating film 55.

Next, as shown in FIG. 7N, patterning is performed for the conductive cover film 18, the first and second capacitor protection insulating films 39, 40, the second interlayer insulating film 41 and the oxidation preventing insulating film 55. Thus, second holes 41d are formed in these films over the upper electrodes 25a.

After the second holes 41d are formed, annealing may be performed in oxygen containing atmosphere in order to recover the capacitor dielectric films 24a from damages encountered in the forgoing steps. Even the annealing is performed, the oxidation preventing insulating film 55 can prevent the second conductive plug 54 from being oxidized.

Subsequently, the oxidation preventing insulating film 55 is subjected to etching back and removed.

Then, as shown in FIG. 7O, stacked metal films are formed on respective upper surfaces of the second interlayer insulating film 41 and the second conductive plug 54 by the sputtering method. Thereafter, the stacked metal films are patterned into metal wiring 57a and bit line conductive pad 57b.

The stacked metal films are composed of a titanium film in thickness of 60 nm, a titanium nitride film in thickness of 30 nm, a copper containing aluminum film in thickness of 400 nm, a titanium film in thickness of 5 nm and titanium nitride film in thickness of 70 nm formed in this order.

Up to this step, the basic structure of the semiconductor device of the present embodiment is completed.

According to the present embodiment, since the third conductive plug 36a and underlying insulating film 15 of the first embodiment are not formed, steps of manufacturing the semiconductor device can be simplified as compared with the first embodiment.

Furthermore, since only one level second conductive plug 54 is formed over the second/source region 8b as a part of the bit line, simple structure can be obtained in the present embodiment than in the second embodiment in which two level plugs 32a, 47a are formed.

Also, like the first embodiment, the upper surfaces of the upper electrodes 25a are covered with the conductive cover films 18. Therefore, upper surfaces of the upper electrodes 25a are not exposed to the etching atmosphere during etching (see FIG. 7J) of the crystalline conductive film 21. Consequently, the upper surfaces of the upper electrodes 25a are prevented from being etched by the etching atmosphere, so that iridium grains are not scattered from the upper surfaces to the etching atmosphere. Thus, the number of iridium grains redeposited onto the side surface of the capacitor dielectric film 24a can be reduced, thereby making it possible to prevent the formation of the leak paths due to the iridium grains.

According to the semiconductor device of the present invention, the capacitor upper electrodes include the first conductive metal oxide film and the second conductive metal oxide film, and the second conductive metal oxide film has an oxidation rate greater than that of the first conductive metal oxide film. This results in a decrease in a catalytic action of the second conductive metal oxide film, enabling the suppression of the amount of hydrogen generated when outside moisture is brought into contact with the second conductive metal oxide film. This enables the prevention of deterioration of the capacitor dielectric film due to hydrogen. This makes it possible to provide improved electrical characteristics of the capacitor including an increase in a remanent polarization charge.

Further, according to the manufacturing method of the semiconductor device of the present invention, the conductive cover film is formed on the second conductive film of the upper electrode, so that the upper surface of the upper electrode is not exposed to etching atmosphere. Accordingly, metallic grains, composed of constituting elements of the upper electrode, are not released into the etching atmosphere, making it possible to suppress the occurrence of a leak path due to the metallic grains redeposited onto the side surface of the capacitor dielectric film. As a result, it is made possible to provide a capacitor of low leakage current and superior electrical characteristics.

What is claimed is:

1. A method of manufacturing a semiconductor device, the method comprising:
   forming a first interlayer insulating film over a semiconductor substrate;
   forming a crystalline conductive film on the first interlayer insulating film;
   forming a first conductive film on the crystalline conductive film;
   forming a ferroelectric film on the first conductive film;
   forming a second conductive film on the ferroelectric film;
   forming a conductive cover film, made of platinum-group element except for iridium, on the second conductive film;
   forming a hard mask on the conductive cover film;
   etching the conductive cover film, the second conductive film, the ferroelectric film and the first conductive film in areas exposed from the hard mask, while using the hard mask as an etching mask, to form a capacitor including an upper electrode made of the second conductive film, a capacitor dielectric film made of the ferroelectric film, and a lower electrode made of the first conductive film, wherein side surfaces of the upper electrode, the capacitor dielectric film and the lower electrode reside in the same plane; and
   etching the hard mask and the crystalline conductive film in areas exposed from the lower electrode using an etching condition under which the hard mask is etched,
   wherein the forming of the second conductive film comprises:
      forming a first conductive metal oxide film on the ferroelectric film; and
      forming a second conductive metal oxide film on the first conductive metal oxide film, wherein a relation $y2/y1 > x2/x1$ holds for compositions $AO_{x1}$ and $BO_{y1}$ (A and B represent metallic elements), where $AO_{x1}$ and $BO_{y1}$ being stoicheiometric compositions of first and second metal oxide constituting the first and second conductive metal oxide film respectively, and for $AO_{x2}$ and $BO_{y2}$, where $AO_{x2}$ and $BO_{y2}$ being actual compositions of the first and second metal oxides respectively.

2. The method of manufacturing the semiconductor device according to claim 1, further comprising:
exposing a side surface of the capacitor to an etching solution after etching the hard mask and the crystalline conductive film.

3. The method of manufacturing the semiconductor device according to claim 1, wherein any one of a platinum film, a ruthenium film, a rhodium film and a palladium film is employed as the conductive cover film.

4. The method of manufacturing the semiconductor device according to claim 1, wherein the forming of the first conductive metal oxide film is carried out by a reactive sputtering method using sputtering gas containing oxygen and inert gas, and
the forming of the second conductive metal oxide film is carried out by a reactive sputtering method using sputtering gas containing oxygen and inert gas, where a flow rate ratio of oxygen in the sputtering gas is higher than in the forming of the first conductive metal oxide film.

5. The method of manufacturing the semiconductor device according to claim 1, further comprising:
annealing the first conductive metal oxide film in an atmosphere containing oxidative gas before forming the second conductive metal oxide film.

6. The method of manufacturing the semiconductor device according to claim 1, further comprising:
annealing the second conductive metal oxide film under a condition where an upper surface of the second conductive metal oxide film is exposed.

7. The method of manufacturing the semiconductor device according to claim 1, wherein, in the forming of the second conductive metal oxide film, the second conductive metal oxide film is formed thicker than the first conductive metal oxide film.

8. The method of manufacturing the semiconductor device according to claim 1, further comprising:
forming a conductivity improving film, made of metallic elements different from metallic elements constituting the conductive cover film, on the second conductive metal oxide film,
wherein the conductive cover film is formed on the conductivity improving film.

9. The method of manufacturing the semiconductor device according to claim 6, further comprising:
forming a second interlayer insulating film covering the capacitor;
forming a hole in the conductive cover film and the second interlayer insulating film over the upper electrode in depth reaching the conductivity improving film; and
forming a conductive plug, made of a glue film and a conductive plug film formed in sequence, in the hole.

* * * * *